(12) United States Patent
Faris

(10) Patent No.: US 6,355,976 B1
(45) Date of Patent: *Mar. 12, 2002

(54) THREE-DIMENSIONAL PACKAGING TECHNOLOGY FOR MULTI-LAYERED INTEGRATED CIRCUITS

(75) Inventor: Sadeg M. Faris, Pleasantville, NY (US)

(73) Assignee: Reveo, Inc, Elmsford, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/123,388

(22) Filed: Jul. 27, 1998

Related U.S. Application Data

(63) Continuation-in-part of application No. 08/626,971, filed on Apr. 3, 1996, now Pat. No. 5,786,629, which is a continuation of application No. 07/882,697, filed on May 14, 1992, now abandoned.

(51) Int. Cl.$^7$ .............................................. H01L 23/02
(52) U.S. Cl. ...................... 257/686; 257/685; 257/723; 257/724
(58) Field of Search ................................ 257/685, 686, 257/723, 724

(56) References Cited

U.S. PATENT DOCUMENTS

| | | | |
|---|---|---|---|
| 3,648,131 A | 3/1972 | Stuby | |
| 4,525,921 A | 7/1985 | Carson et al. | |
| 4,706,166 A | 11/1987 | Go | |
| 4,764,846 A | * | 8/1988 | Go |
| 4,983,533 A | 1/1991 | Go | |
| 5,031,072 A | 7/1991 | Malhi et al. | |
| 5,099,488 A | 3/1992 | Ahrabi et al. | |
| 5,138,438 A | 8/1992 | Masayuki et al. | |
| 5,239,187 A | 8/1993 | Schuhl et al. | |
| 5,266,833 A | 11/1993 | Capps | |
| 5,281,852 A | * | 1/1994 | Normington |
| 5,343,366 A | * | 8/1994 | Cipolla et al. |
| 5,376,825 A | * | 12/1994 | Tukamoto et al. |
| 5,473,198 A | 12/1995 | Hagiya et al. | |
| 5,502,333 A | * | 3/1996 | Bertin et al. |
| 5,652,462 A | * | 7/1997 | Matsunaga et al. |
| 5,698,895 A | 12/1997 | Pedersen et al. | |

OTHER PUBLICATIONS

International Search Report, 1998.

* cited by examiner

*Primary Examiner*—Sheila V. Clark
(74) *Attorney, Agent, or Firm*—Thomas J. Perkowski, Esq., P.C.

(57) ABSTRACT

Disclosed is method and apparatus for packaging multilayered integrated circuit (IC) chips, on which logic circuits and/or memory arrays are disposed and interconnected in a novel way permitting the addressing (i.e. selection) of the logic circuits and/or arrays on these IC chip layers using a minimum number of connections and with the shortest propagation delays.

68 Claims, 13 Drawing Sheets

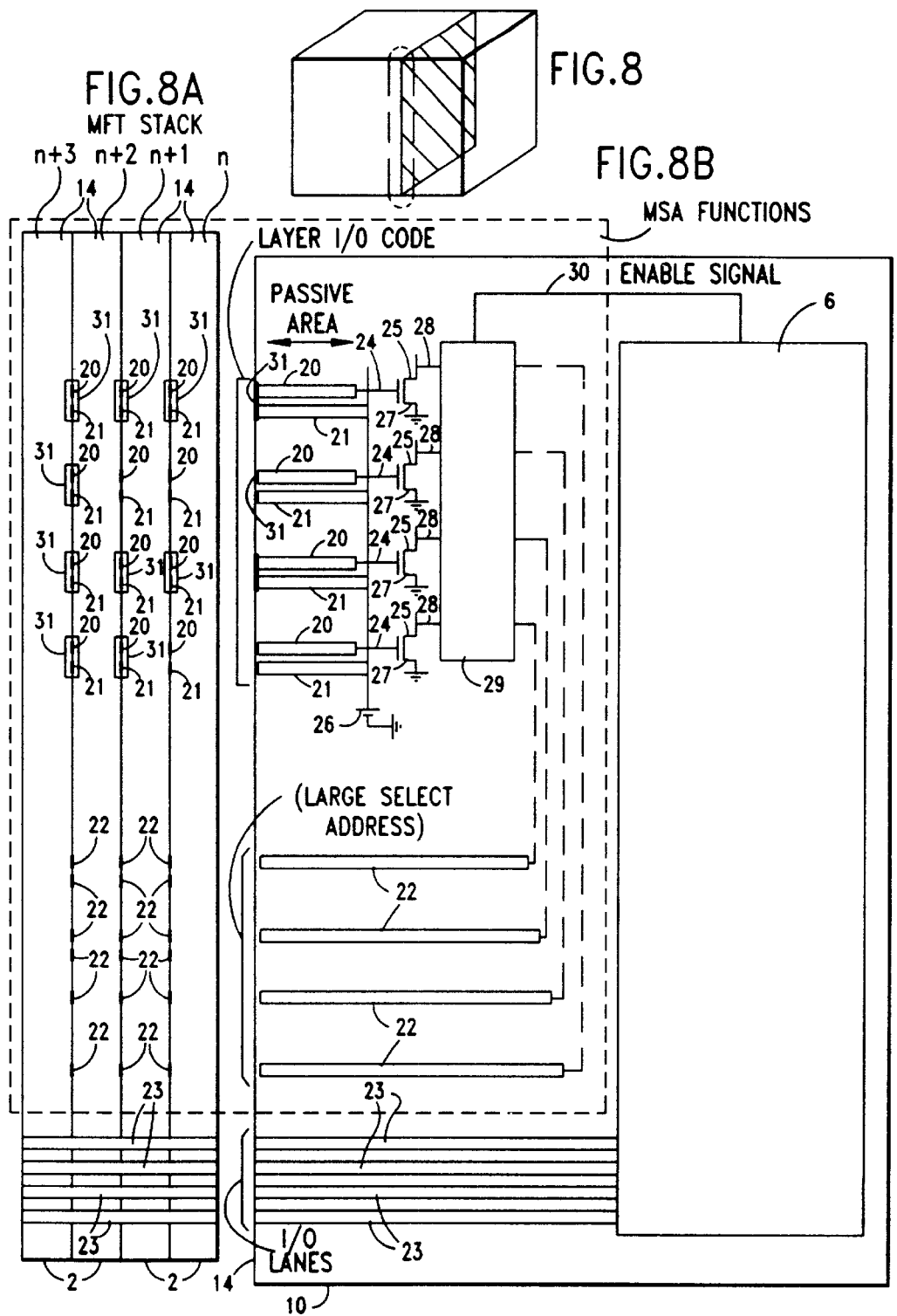

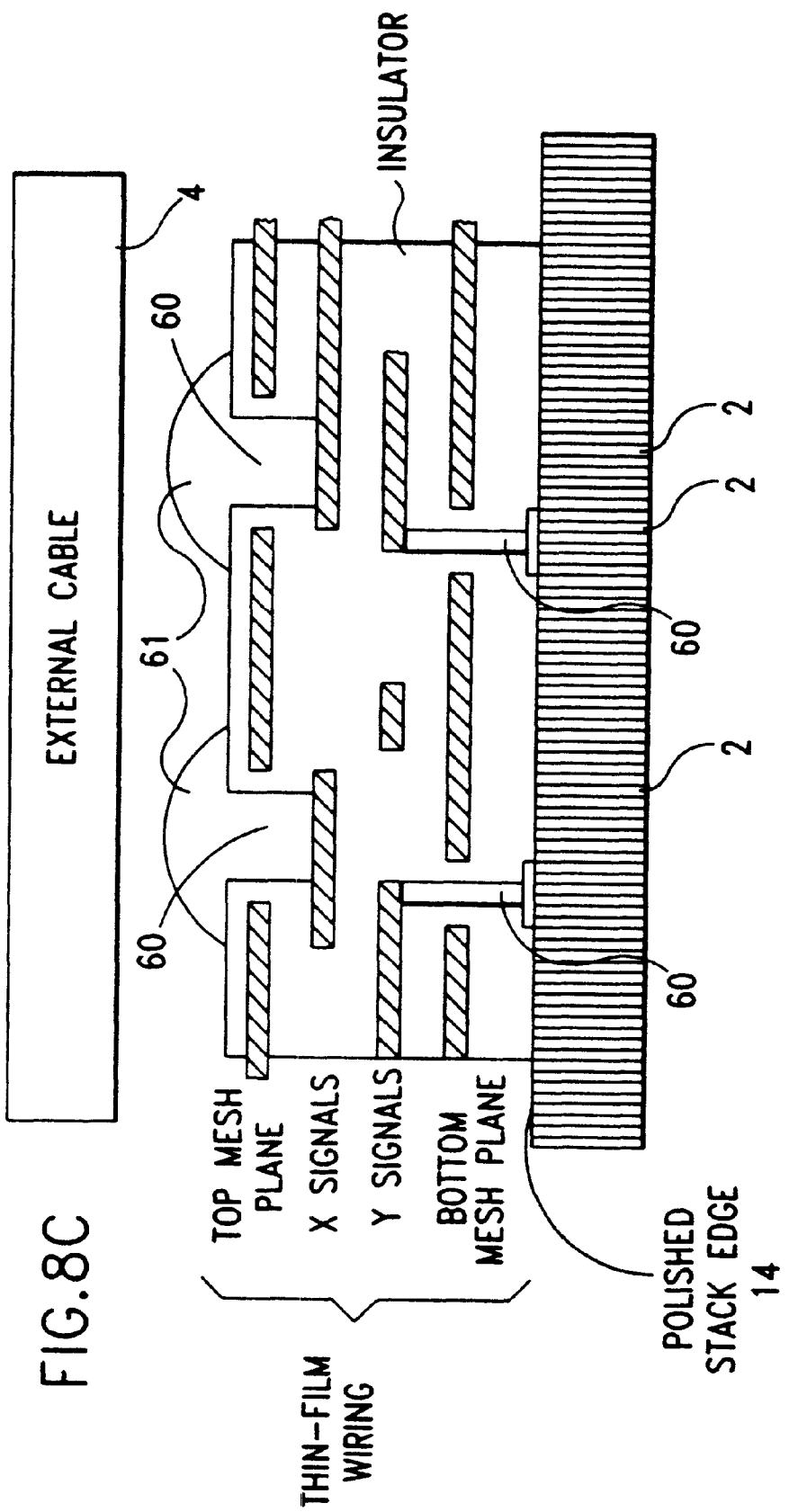

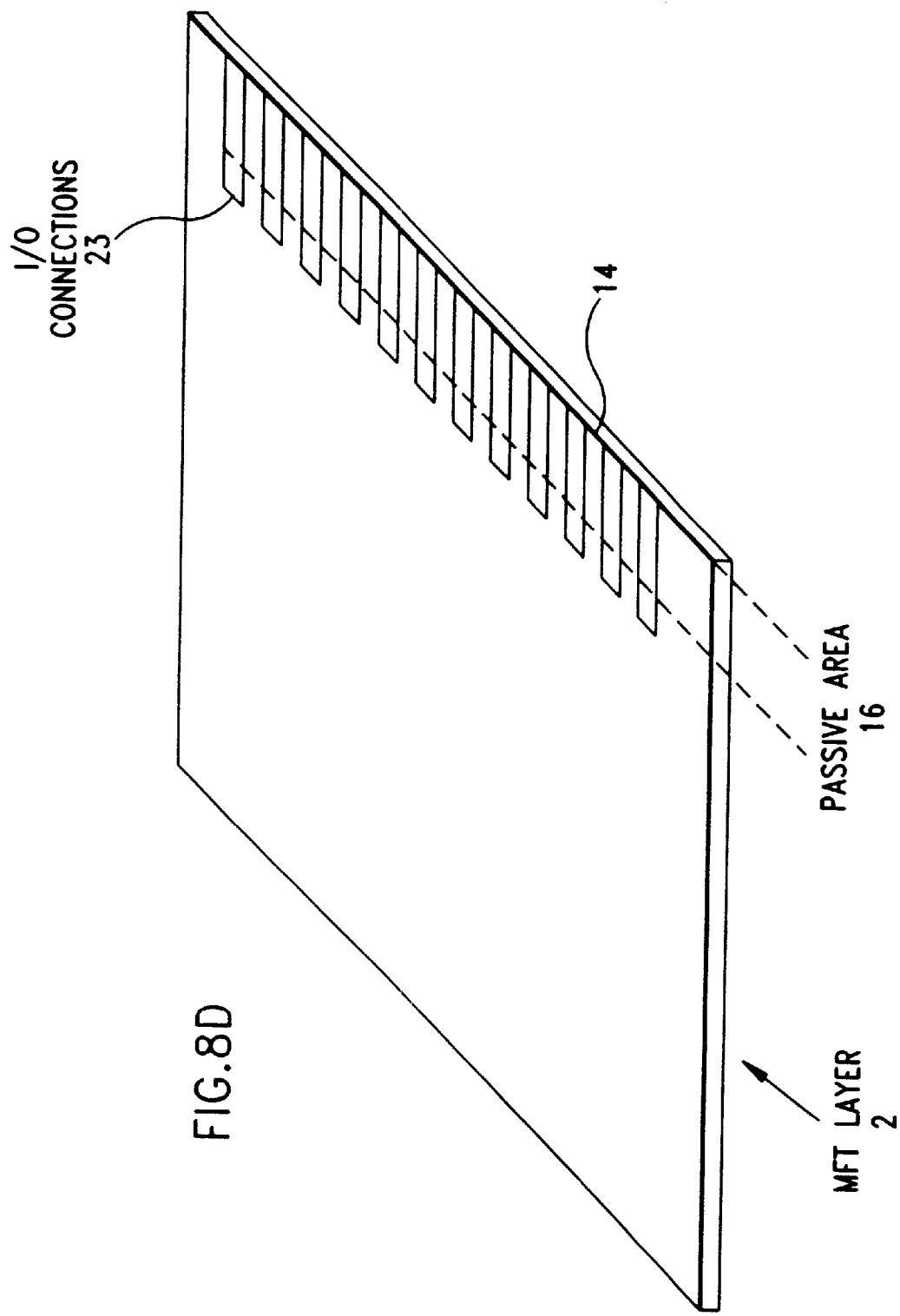

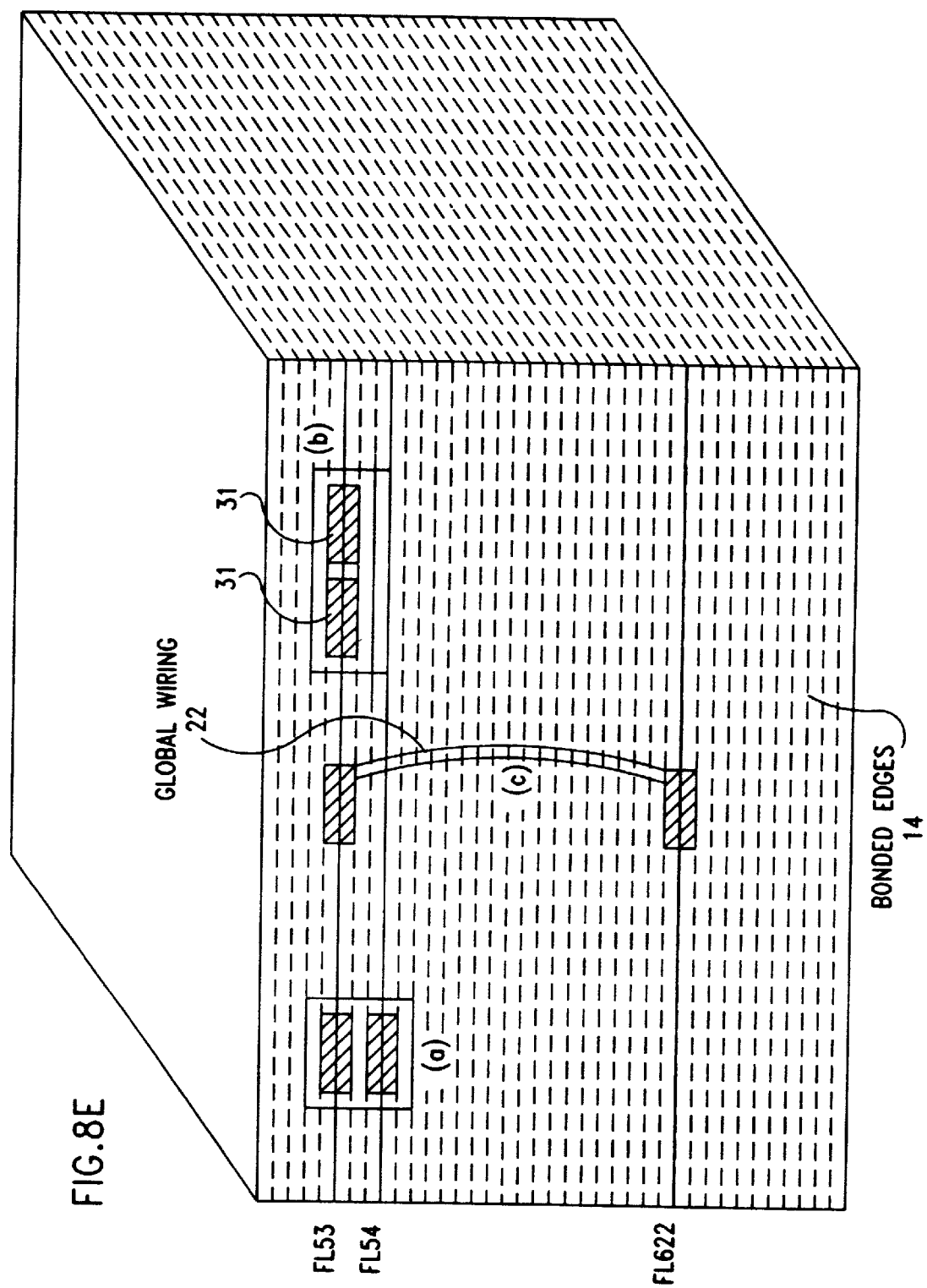

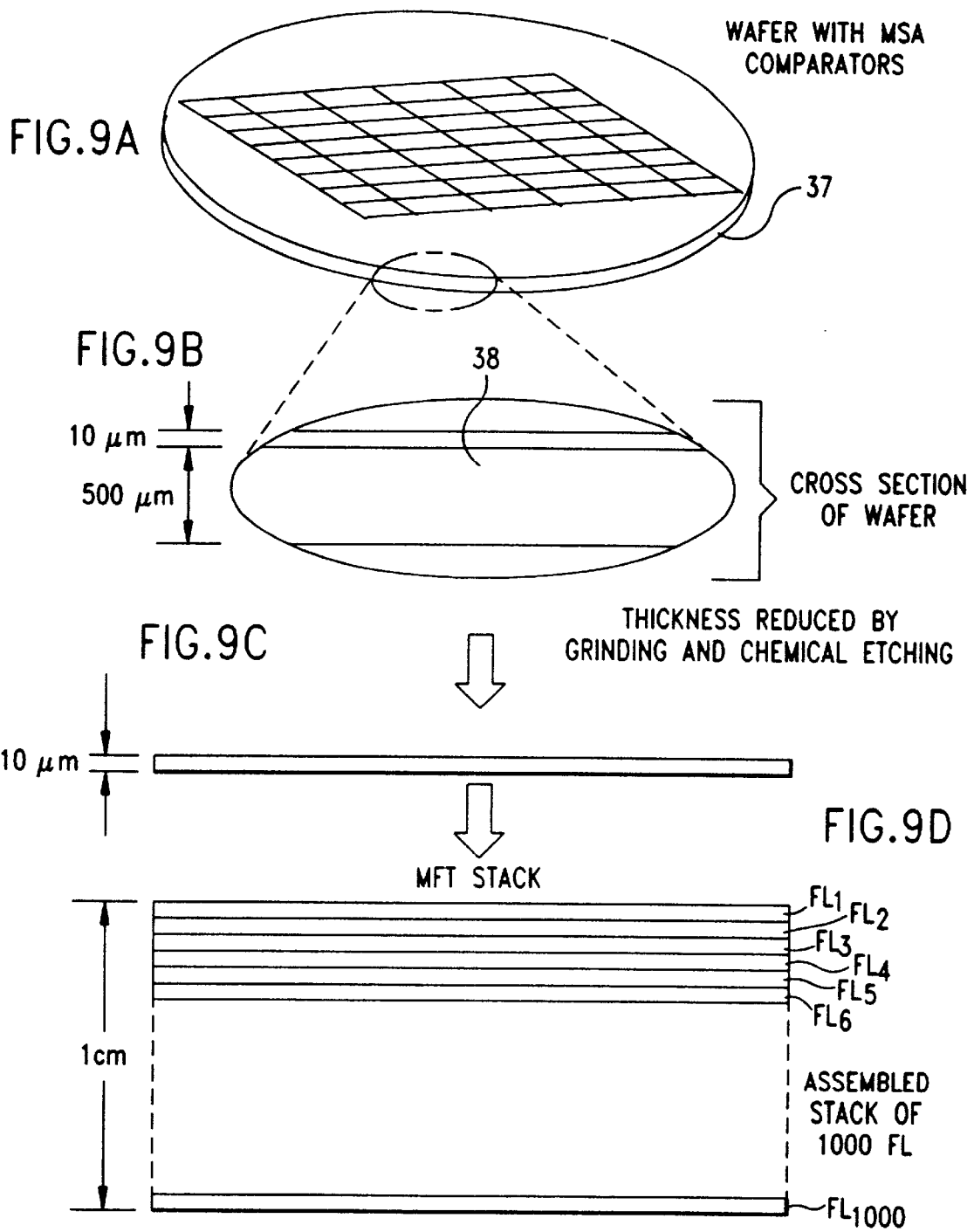

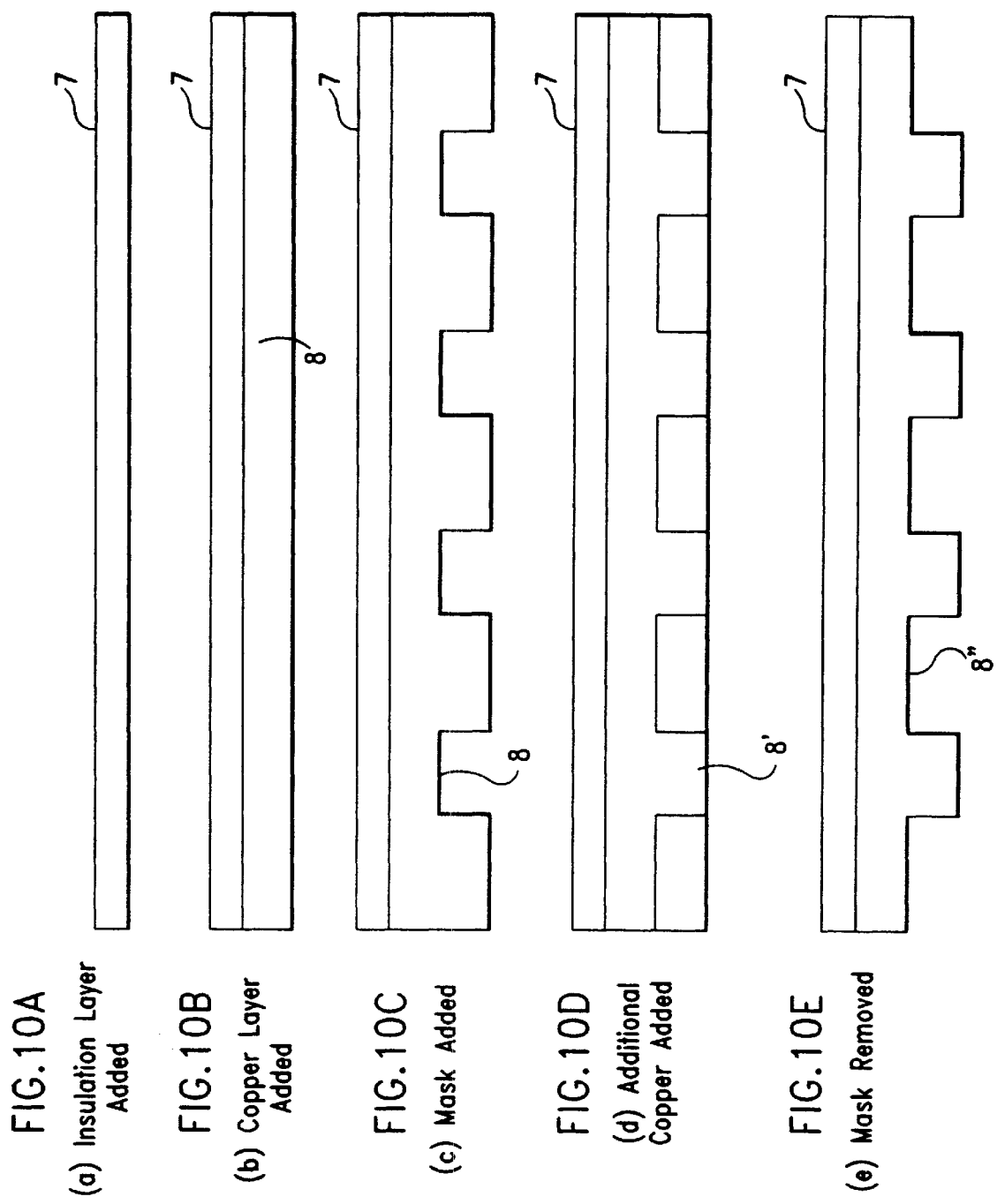

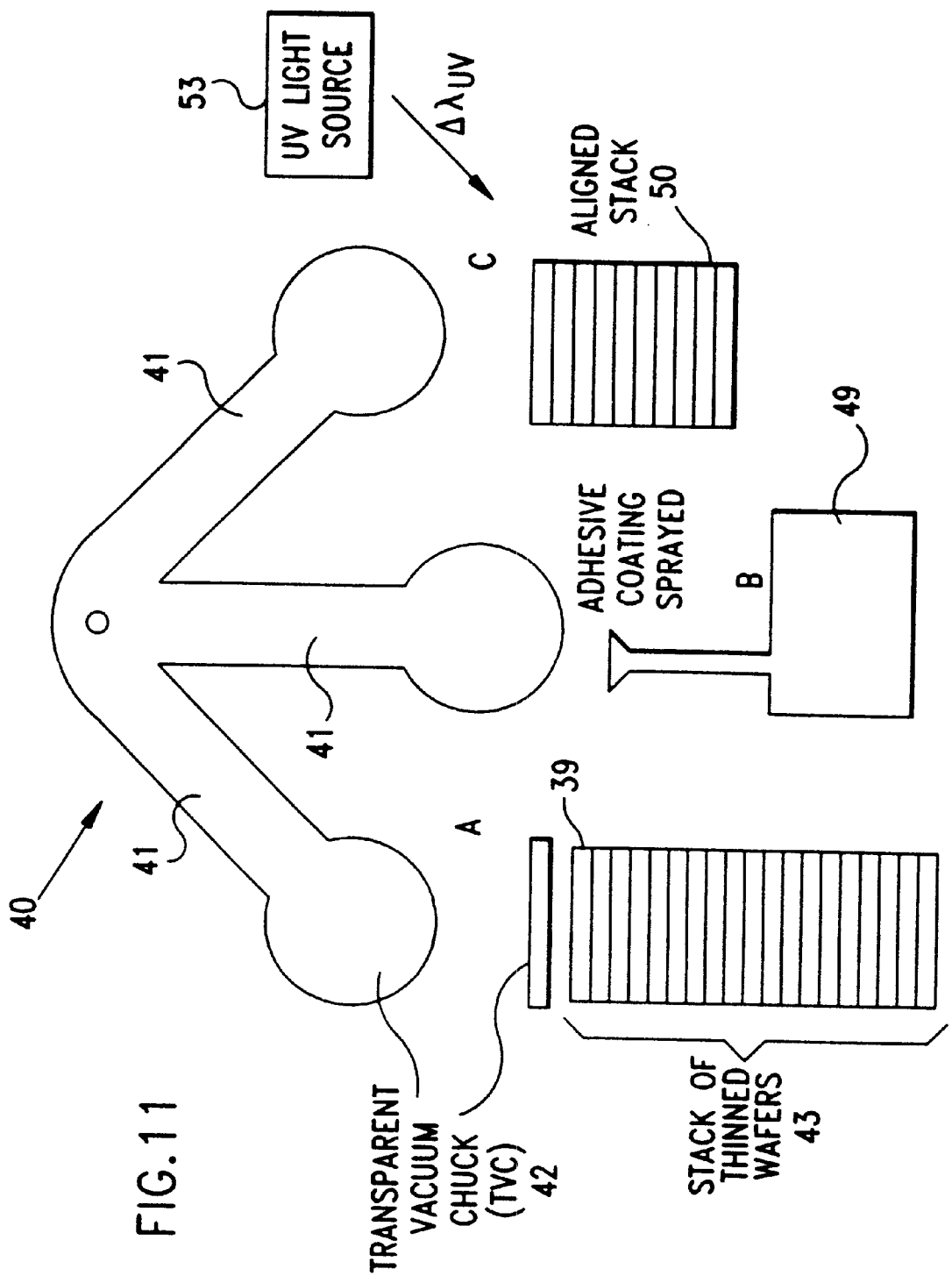

THREE-DIMENSIONAL PACKAGING TECHNOLOGY FOR MULTI-LAYERED INTEGRATED CIRCUITS

RELATED CASES

The present application is a continuation-in-part of application Ser. No. 08/626,971 entitled "3-D Packaging Using Massive Fillo-Leaf Technology" filed Apr. 3, 1996, now U.S. Pat. No. 5,786,629 which is a continuation of Ser. No. 07/882,697 filing date May 14, 1992 now abandoned, owned by Reveo, Inc. and incorporated herein by reference in its entirety.

BACKGROUND OF INVENTION

1. Technical Field

The present invention relates generally to a three-dimensional package for massive layers of integrated circuit (IC) chips, on which logic circuits and/or memory arrays are disposed and interconnected in a novel way to permit addressing (i.e. selection) of the circuits and/or arrays on these circuit layers using a minimum number of connections and with the shortest propagation delays.

2. Brief Description of Prior Art

Today, most electronic packages are largely two-dimensional in arrangement. Typically, multiple chips are placed on a single planar module called a Multiple Chip Module (MCM). These modules are coarse in granularity, with feature sizes of 5 to 10 mils. Because of this coarse granularity, many metallization levels are required to wire the module. Typically, this category of IC packaging involves twenty to forty levels of metallization.

To reduce the number of metal layers, and thereby improve performance, newer 2-D modules use finer features such as thin-film wiring with line widths on the order of 10 to 20 $\mu$m. A typical arrangement is to place four chips on a single module to comprise a single microprocessor (MP). One chip is the computer (CPU), one chip is the storage control unit (SCU), while the remaining two chips are the cache memory. The average chip has dimensions of about 10 mm×10 mm. To allow for reasonable wiring, the module is likely to be 40 mm×40 mm. Even if placement algorithms are used to arrange chips and the function on the chips, typical chip-to-chip signal paths are of the order of the chip size, say 10 mm, For a transmission line of 15 $\mu$m width and lengths greater than 10 mm, line resistance becomes important and wiring rules are needed to restrict the signal length to achieve reasonable delays. Notably, the signal path length to main memory is much larger.

The MCMs described above are typically mounted on a card, and then the card is mounted on a board. Thus, the module is considered the first package level, the card the second level, and the board the third level. Clearly, there is much wasted space using such an arrangement that an opportunity is presented to explore newer more space-efficient packaging concepts for IC chips.

The fastest micro-processors using MCM packaging today have about 5 nanosecond (NS) cycle time. It is becoming increasingly evident that 2-D MCM packaging-techniques will not achieve significant improvements beyond 5 NS, making newer concepts extremely attractive.

Recognizing the limitations of two-dimensional MCM packaging technology, a number of companies including Irvine Sensors, Texas Instruments (TI) and Thomson have developed 3-D multilayer IC packaging techniques which involve stacking IC chips in the third dimension as shown in FIG. 2. In general, the basic idea here is to control the size of the IC chips with precision dicing, stack them vertically, bond them together, polish one or more sides and deposit wires on the polished sides to interconnect the chips. While these prior art 3-D packaging approaches have been shown to work, they have many shortcomings and drawbacks, including: limitations on the number of IC chips which can be stacked vertically; very high manufacturing costs; and complex interconnection schemes.

Texas Instruments (TI) and Thompson are using a stacked tape-automated bonding (TAB) approach which has significant limitations in that the number of vertically-stacked chip layers is 20 or less.

Irvine Sensors Corporation (ISC) is pursing an approach that is more promising, although it too suffers from the following limitations: the number of layers of IC chips that can be stacked is limited to less than 100 because of alignment difficulties inherent in the manufacturing method; the number of layers which can be interconnected is limited unless each chip is individually personalized, a step that increases cost dramatically; the edge wiring density is low due to inaccurate alignment between the vertically disposed chips; the low yield and high cost because tested chips must have sizes with narrow tolerances to achieve certain alignment accuracy; the manufacturing process is too costly as the number of layers approaches 100; thermal and mechanical consideration add to manufacturing difficulties (i.e. heat must be carried to the edge of the stack for removal of IC chip layers and on an interchip bonding layer must be provided between to avoid delamination due to thermal mismatch); and the lack of flexibility in stack size.

In addition to the above-described activity in the 3-D packaging art, a number of 3-D IC packaging techniques have been proposed in the following U.S. Letters Patent. In U.S. Pat. No. 4,525,921, entitled "High-Density Electronic Processing Package-Structure and Fabrication", a high density electronic package module has been proposed, comprising a stack of semiconductor chips having integrated circuitry on each chip. To permit the emplacement of thin film circuitry on the access ends, the access plane is etched to cut back the semiconductor material and then covered with passivation material. Thereafter, the passive material is lapped to uncover the ends of electrical leads on the chips. The leads are then connected to end plane wiring which is formed on two edges of stacked semiconductor chips. Chips are stacked in a supporting frame and bonded together using a thermally cured epoxy which remains over the whole surface area disposed between pairs of chips. In the arrangement disclosed in U.S. Pat. No. 4,525,921, the conductors which extend from the stacked chips extend beyond the ends of the chips by etching back the semiconductor material.

In U.S. Pat. No. 4,764,846 entitled "High Density Electronic Package Comprising Stacked Sub-Modules", a high density electronic package has been proposed, wherein a stack of layer-like sub-modules have their edges secured to a stack-carrying substrate. The latter is in a plane perpendicular to the planes in which the sub-modules extend. Each sub-module has a cavity inside which one or more chips are located. Each cavity-providing sub-module may be formed either by securing a rectangular frame to a chip-carrying substrate or by etching a cavity in a single piece of material. In the latter case, chips are mounted on the flat surface of one sub-module, and located inside the cavity of the next sub-module. In this reference, an electronic module is formed by first constructing a plurality of individual chip carriers, each of which has a chip mounted in a cavity in the carrier. Then, the chip carriers are secured together in a laminated stack, and the stack as a unit, is secured to a wiring board or stack carrying substrate, wherein wiring which lies in a plane parallel to the plane of the chip. Thus, in the reference, chips are placed on substrates which are then placed in chip carriers and the chip carriers are stacked to form a module.

In U.S. Pat. No. 4,706,166 entitled "High-Density Electronic Modules-Process and Product", a high density electronic module has also been proposed, wherein integrated circuit chips are stacked. The stacked chips are glued together with their leads along one edge so that all the leads of the stack are exposed on an access plane. Bonding bumps are formed at appropriate points on the access plane. A supporting substrate formed of light transparent material such as silicon, is provided with suitable circuitry and bonding bumps on its face. A layer of insulation is applied to either the access plane or the substrate face, preferably the latter. The bonding bumps on the insulation-carrying surface are formed after the insulation has been applied. The substrate face is placed on the access plane of the stack, their bonding bumps being aligned and then bonded together under heat and pressure. A layer of thermally conductive (but electrically non-conductive) adhesive material is inserted between the substrate and stack. The substrate and stack combination is then placed and wire bonded in a protective container having leads extending therethrough for external connection.

In general, the 3-D Electronics packaging schemes disclosed in the above referenced US Letters Patents suffer from the shortcomings and drawbacks described hereinabove.

In view of the state of knowledge and skill in the art, it is clear that three-dimensional stacking of rigid IC chips as a packaging concept is known in the integrated circuit packaging art. However, this packaging technique suffers from numerous shortcomings and drawbacks which prevent it from being widely used in commercial practice. Thus, there is a great need for improved ways and means of packaging electronic circuitry in order to overcome the shortcomings and drawbacks of prior art technology.

OBJECTS AND SUMMARY OF THE INVENTION

Accordingly, a primary object of the present invention is to provide an improved method and apparatus for packaging multi-layered integrated circuits in a way which avoids the shortcomings and drawbacks of prior art technologies.

Another object of the present invention is to provide an improved three dimensional integrated circuit (IC) chip packaging method that enables stacking together thousands of integrated circuit layers realized on very thin and flexible layers, referred to as "fillo-leaf" circuit layers, and binding together the same along one end thereof to form a massive fillo-leaf circuit layer (MFT) module.

Another object of the present invention is to provide an improved three-dimensional multilayer IC chip package for integrated circuits which incorporates flexible or rigid semiconductor elements called fillo-leaf circuit layers, on which integrated circuits in the form logic circuits or memory arrays are disposed and between which a heat carrying medium can flow for improved thermal management.

Another object of the present invention is to provide an improved three dimensional multilayer IC chip packaging technology, wherein a novel massive IC chip selection architecture (MSA) is employed in order that tens of thousand of IC circuit layers can be addressed with a minimum number of wiring connections.

Another object of the present invention is to provide an improved multilayer IC chip packaging technology, wherein the massive IC chip selection architecture enables one to vertically stack, for example, 16,384 (or $2^{14}$) circuit layers, and providing each such fillo-leaf circuit layer with a unique address using only 14 wiring lines.

Another object of the present invention is to provide such an improved multilayer IC chip packaging design that enables advanced DRAM circuit layers (256M-bit to 1G-bit) to be fully interconnected so as to form 3-D MFT modules that have TerraBit(TB) storage capabilities and occupy 2–4 $cm^3$ of space or less.

Another object of the present invention is to provide such an improved form of multilayer IC chip packaging technology, wherein it is possible to achieve electronic information storage and retrieval capacities in the TerraBit (TB) to PetaBit (PB) range.

Another object of the present invention is to provide such an improved form of multilayer IC chip packaging technology, which enables the performance levels of massively parallel processing systems to be extended into the Tera-OPS to Peta-OPS range.

Another object of the present invention is to provide an improved manufacturing infrastructure which enables unprecedented levels of multilayer IC chip packaging density capable of satisfying the needs of the high performance computers (HPC) having Peta-OPS and Peta-Bit capacities.

Another object of the present invention is to provide an improved manufacturing infrastructure that enables high-throughput production of MFT modules, and ultra-high performance MFT-based systems.

Another object of the present invention is to provide a novel method of stacking together thousands of 5 $\mu$m thick silicon fillo-leaf circuit layers and interconnecting them into higher performance systems (MFT stacks) in an economical and reliable manner.

Another object of the present invention is to provide a novel method of vertically layering thousands (i.e. 1,000 to 10,000) thinned IC wafers in order to achieve unprecedented levels of memory and logic density.

Another object of the present invention is to provide an improved method and apparatus for producing, handling, stacking, and interconnecting ultra-thin IC circuit layers of 5 $\mu$m thickness or less in an automated manner.

Another object of the present invention is to provide a novel form of Massive Chip Selection Architecture (MSA) which avoids the costly personalization of each IC chip layer, by carrying out a single metallization step at the bonded edge of the circuit layers in order to allow N lines to select $2^N$ vertically stacked circuit layers (e.g. for N=14), 16,384 layers can be interconnected and uniquely addressed using only 14 wires.

Another object of the present invention is to provide a novel method of achieving high edge-wiring density within a 3-D multilayered IC chip package using a novel alignment technique that ensures alignment accuracy better than 1 $\mu$m.

Another object of the present invention is to provide a novel multilayer IC chip packaging system design that enables an improved measure of thermal management.

Another object of the present invention is to provide apparatus for the manufacturing MFT devices of the present invention comprising 400 or more layers of CMOS chips, wherein each chip is provided with the MSA function plus some logic function.

Another object of the present invention is to provide a novel way of increasing the volumetric circuit densities of multilayered IC chip packages to unprecedented levels, while minimizing propagation delays and improving performance well beyond the level presently possible using prior art technologies.

Another object of the present invention is to provide a novel multilayer IC chip packaging technique which enables tens of thousands of stacked, flexible circuit layers to be addressed using a minimum number of interconnection lines, and shortest propagation delays.

Another object of the present invention is to provide a novel method of fabricating a three-dimensional multilayer IC chip package involving the steps of formatting radiation-transparent edge portions within each IC chip on each wafer so that, upon stacking thinned wafers, ultra-violet (or other radiation) curable material is fixed in order to bond fillo-leafs circuit layers together only at passivation on each IC chip, and also encoding each fillo-leaf circuit layer to provide each layer with its own unique address.

Another object of the present invention is to provide a novel multilayer IC chip packaging technique which enables unprecedented levels of information storage retrieval capacity within diverse types of systems and devices.

The objects of the present invention can achieved by providing a novel three-dimensional package for IC chips provided on multiple layers of wafer material. The novel package design comprises a plurality of subassemblies or fillo-leaf circuit layers made of materials such as silicon, germanium, gallium arsenide, sapphire or lithium niobate. The fillo-leaf circuit layers are bonded together at a radiation-transparent edge portion by an ultra-violet or other radiative light curable material, and extend in a cantilevered fashion from the bonded edge. The fillo-leaf circuit layers carry integrated circuits (ICs) like CMOS circuits, silicon-on-sapphire, superconducting Josephson circuits, fiber optic circuits and the like. Whatever technology is used, each IC has data transmission lines which extend from the circuits used to the bonded edges of the fillo-leaf circuit layers. Some of these are the usual data, address and power lines. Pairs of lines called encoder lines, are connected to a comparator or similar means and extend to the bonded edges of the IC chips.

Once the stack of fillo-leaf circuit layers is formed, by dicing and/or slicing operations carried out on a stack of bonded wafers, the bonding edges are polished, exposing inter alia, the tips of the encoder lines and providing a planar surface. Thin-film conductors are then formed on the planar surface. Among such thin-film conductors are shorting straps or interconnections which either short-circuit pairs of encoder lines or leave them open. In this way, current either flows in a pair of encoder lines or it does not, providing a unique digitally coded address for each fillo-leaf circuit layer in a stack of such structures. Each fillo-leaf circuit layer in a stack or module of one-thousand fillo-leaf circuit layers may be encoded permitting fillo-leaf circuit layers to be by-passed or selected pursuant to a stored program depending on their operating status determined though testing. Other lines formed on the radiation-transparent edge portions of the fillo-leaf circuit layers carry out known functions and may be connected via interconnections to a flexible connector to the outside which provides data and/or power signals. The fillo-leaf circuit layers in the resulting package may be flexible or rigid and cooled by a fluid coolant such air or other heat exchanging medium. Each fillo-leaf circuit element may carry logic circuits or memory arrays or combinations of both, and stacks or modules of ganged fillo-leaf circuit layers may be diced from thinned wafers to provide massively parallel data processors.

The three-dimensional IC chip packaging module of the present invention and its subassemblies are fabricated starting at the wafer level where a plurality of IC chip layers are formed on each wafer with the encoder and transmission lines of each IC chip layer extending to one edge thereof. Each IC chip is on a raw wafer provided with simple logic circuits, and the I/O ports from these circuits are brought out to one edge of the IC chip and radiation-transparent channels (or regions) are created in those wafers running parallel to the I/O circuit edges. The radiation-transparent edge channels (or regions) on each IC chip will enable UV or other radiation to be transmitted through each IC chip layer (i.e. thinned wafer) and onto a radiation-curable adhesive layer applied to thinned wafers during the stacking and bonding steps of the fabrication process. Glass channels can also be formed to allow the wafer substrate to be thinned by grinding/etching and polishing to 10–20 $\mu$m. Alignment marks are applied to the wafers for use when stacking multiple wafers. Such fractures allow full automaton of IC layer alignment through the use of optical comparators or like devices.

The wafers are subjected to a thinning step so that the thinned wafer, when diced, provides flexible fillo-leaf circuit layers. The thinned wafer then has a heat dissipating element formed on its underside. The wafer is then masked and a window, transparent to ultra-violet light or other radiation, is formed at an edge of each fillo-leaf circuit layer by oxidation or, in the instance of a sapphire substrate, by masking with the heat dissipating element. A wafer is then aligned to a common fixed reference using alignment marks on the wafer. An ultra-violet light curable material is spread on the wafer and another wafer aligned over it. Ultra-violet light is beamed at the wafer such that it passes through the U.V. transparent windows curing the light curable material in registry with the windows. The uncured material is later removed.

After the desired number of thinned wafers have been stacked, the wafer stack is diced into a plurality of fillo-leaf circuit layer modules each consisting of a plurality of fillo-leaf circuit layers. Each module is then polished on the bonded edge portion so that all interconnection lines terminate at the outer edge of the same edge portions and interconnects formed which include shorting straps for selected pairs of encoder lines. Pairs of strapped interconnection lines identify each fillo-leaf circuit layer with its own code to permit selection of circuits or arrays on the semiconductor fillo-leaf circuit layer. Other interconnections carry address information, data and power to these circuits. Once these interconnections have been formed, one or more interconnect levels incorporating vias may be fabricated within the last level for connecting to data and power sources. The modules are fluid cooled and may be ganged together to permit massively parallel data processing.

The innovative architectures embodied in multilayered IC chip packaging system of the present invention should enable significant improvements in the performance of (i) massively parallel processing systems beyond the Tera-OPS to Peta-OPS range, and (ii) ultra mass storage systems beyond the Tera-Bit to Peta-Bit range.

BRIEF DESCRIPTION OF THE DRAWINGS

For a more complete understanding of the Objects Of The Present Invention, the following Detailed Description Of The Illustrative Embodiments set forth below should be read in conjunction with the accompanying Drawings, wherein:

FIG. 8 is schematic representation of a massively fillo-leaved module according to the present invention, wherein a single fillo-leaf circuit layer element is identified for a more detailed illustration in FIGS. 8A and 8B;

FIG. 8A is a partially schematic representation of the top view of the n-th fillo-leaf circuit layer showing pairs of encoder lines and address lines extending from the outer edge of thereof to a comparator circuit formed thereon, which are used to realize the Massive IC Chip Selection Architecture (MSA) employed in the packaging system of the present invention;

FIG. 8B is a partially schematic representation of the side view of the (n, n+1, n+2 and n+3)th fillo-leaf circuit layers of massively fillo-leaved module depicted in FIG. 8, showing a plurality of fillo-leaf circuit layers and how each such fillo-leaf circuit layer is uniquely encoded;

FIG. 8C is a schematic representation of the thin-film wiring architecture employed to realize interconnection between the stack of fillo-leaf circuit layers within the module;

FIG. 8D is a schematic representation of a single fillo-leaf circuit layer having a single set of edge-located input/output (I/O) connections formed thereon;

FIG. 8E is a schematic representation of a multilayer IC module of the present invention showing local and global wiring constructions formed on the bonded edge of the massive stack fillo-leaf circuit layers contained therein;

FIGS. 10A through 10E set forth a schematic representation of the steps involved in a method for forming patterned copper fins along the underside surface of each fillo-leaf circuit layer in order to improve its thermal efficiency;

FIG. 11 is a schematic diagram of a fillo-leaf circuit layer alignment robot (FLAR) system having an arm of an adjustable length and rotatable through stations A, B and C, for use in handling, stacking, aligning, and bonding thinned wafers (containing IC chips) of the present invention during MFT module fabrication;

DETAILED DESCRIPTION OF THE ILLUSTRATIVE EMBODIMENTS OF THE PRESENT INVENTION

Figures 1, 2:
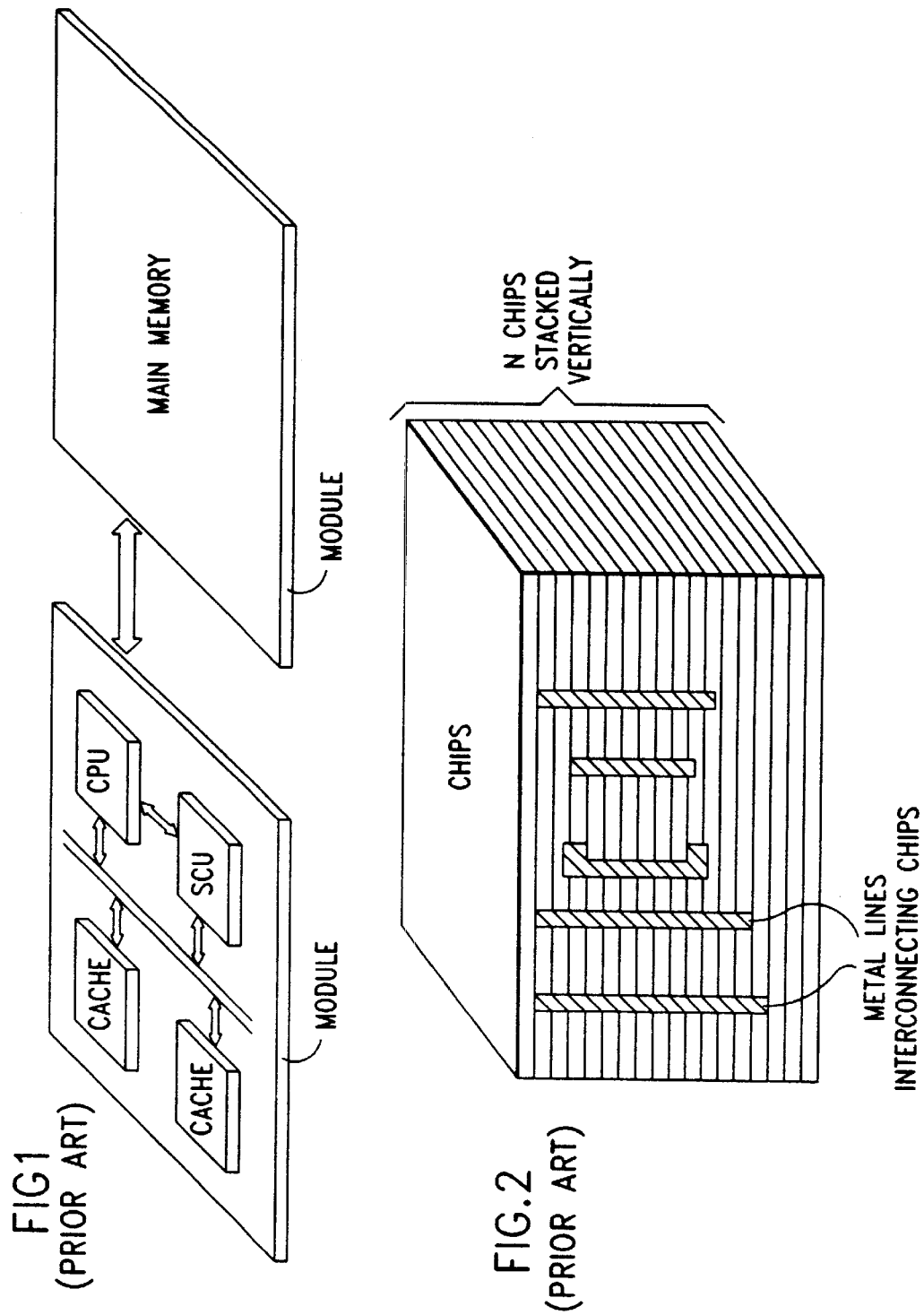
FIG. 1 is a schematic diagram of a prior art 2-D IC chip packaging system based on Multi-Chip-Module (MCM) technology.
FIG. 2 is a schematic diagram of a prior art 3-D IC chip packaging system based on stacking N IC chips in a vertical manner, and depositing the interconnection metallization on one or more polished sides of the vertical stack.

Referring now to the figures in the accompanying drawings, the illustrative embodiments of the present invention will be described in detail, wherein like elements will be indicated in figures with like reference numerals.

Figure 3:
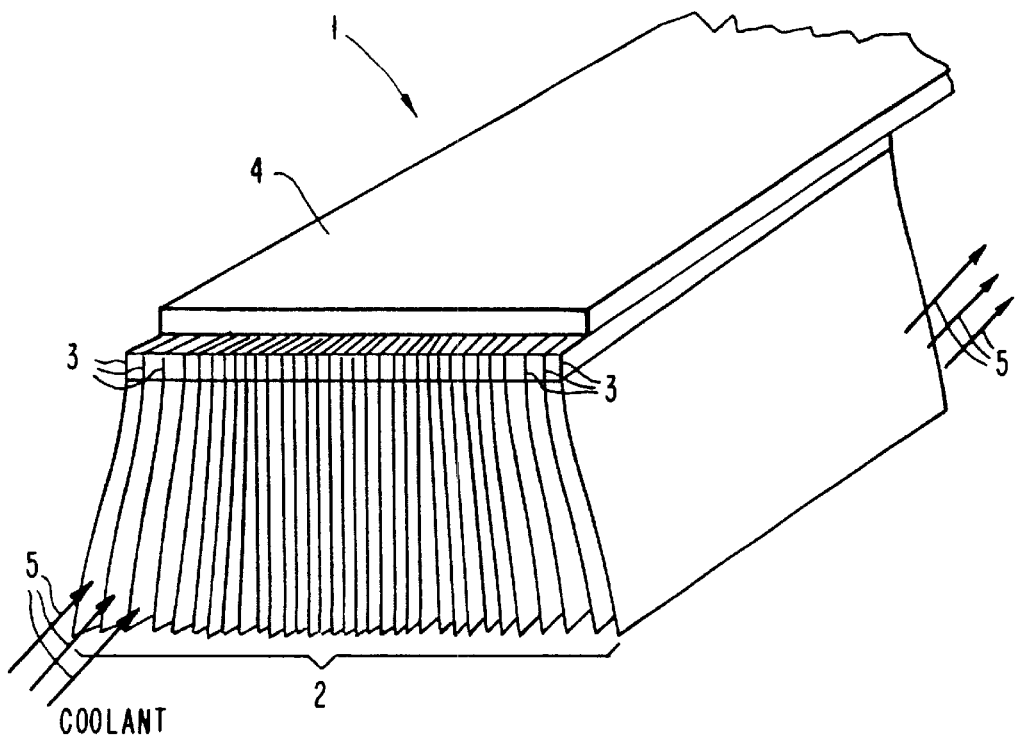
FIG. 3. is a perspective view of an MFT (Massive Fillo-leaf Technology) packaging module fabricated in accordance with the principles of the present invention, wherein coolant (e.g. air or other medium) can flow between the stacked assembly of flexible ultra-thin IC layers (i.e. "fillo-leaf circuit layers") in order to carry out thermal management operations within the packaging system.

In FIG. 3, a perspective view of a Massive Fillo-leaf Technology (MFT) module according to the present invention is schematically illustrated. As shown, the MFT module 1 comprises a plurality of elements, i.e. integrated circuit (IC) layers, hereinafter referred to as "fillo-leaf" circuit layers 2, which are bonded together at their edges 3 so that the fillo-leaf circuit layers 2 extend in a cantilevered fashion from bonded edges 3. Each fillo-leaf circuit layer 2 supports a plurality of pairs of electrically or light conductive lines (not shown in FIG. 3) which extend from a common plane of bonded edges 3 to one or more comparators or other means (not shown in FIG. 3) forming a portion of the Massive IC Chip Selection Architecture (MSA) of the present invention. As will be described in greater detail hereinbelow, the MSA hereof permits selection of any desired fillo-leaf circuit layer 2 from among thousands of such fillo-leaf circuit layers using a minimum number of connections and shortest signal propagation delays.

As shown in FIG. 3, fillo-leaf circuit layers 2 also include a first plurality of electrically conductive or light conductive lines (not shown in FIG. 3) which feed address signals to the MSA comparator mentioned above. If the address signals match the specifically coded address of a fillo-leaf circuit layer 2, a circuit area (not shown) on a fillo-leaf circuit layer 2 is activated by a signal generated from the MSA comparator. As will be shown in greater detail hereinafter, each fillo-leaf circuit layer 2 is provided with its own unique coded address realized by forming strapped or unstrapped pairs of lines along the bonded edge of the fillo-leaf circuit layer stack. Then, when address signals are provided to each of the fillo-leaf circuit layers 2 simultaneously, only the MSA comparator associated with the addressed fillo-leaf circuit layer 2 will provide a selection signal to activate a circuit area on that fillo-leaf circuit layer 2. Each fillo-leaf circuit layer 2 supports an additional plurality of electrically conductive or light conductive lines (not shown in FIG. 3) which carry data, memory selection information and power to a logic circuit area or memory array disposed on fillo-leaf circuit layer 2 once a circuit area or array has been activated by a signal generated from the MSA comparator. This additional plurality of lines extends from the active devices of a circuit or array to edge 3 of each fillo-leaf circuit layer 2. In FIG. 3, all signals and required power for module 1 are brought to edges 3 of fillo-leaf circuit layers 2 via a flat interconnection cable 4 or other appropriate interconnection medium. In FIG. 3, arrows 5 represent coolant, e.g. air or other appropriate cooling fluid, which can flow among fillo-leafs circuit layers 2 to remove heat generated by the operation of the circuits in the various circuit areas of each of fillo-leaf circuit layer 2.

The fillo-leaf circuit layers 2 may be made, for example, from semiconductor wafers which have been thinned by chemical-mechanical polishing, or other suitable means, to such an extent that, when diced and/or sliced, thinned wafers are very flexible. An appropriate semiconductor material such as silicon, germanium or gallium arsenide or other III-V compound semiconductor may be utilized to form fillo-leaf circuit layers 2. It should be appreciated, however, that fillo-leaf circuit layers 2 may be made from insulating material such as sapphire and that semiconductor devices may be formed in juxtaposition with a surface thereof in a manner well-known to those skilled in the semiconductor arts. Similarly, fillo-leaf 2 may be made from a material such as lithium niobate which is used in the fabrication of optical switching devices. Optical switching devices may be imbedded in the lithium niobate in the form of titanium dioxide line portions of which are rendered transmissive or non-transparent to light by the application of electric fields in a manner well known in the art. Also, Josephson junction devices and circuits may be disposed in juxtaposition with the surface of a material such as silicon to form the elements of fillo-leaf type circuits 2 shown in FIG. 3. Any material which can carry or contain switchable devices, storage devices or logic circuits may be used in the practice of the IC packaging techniques of the present invention. Indeed, even a metal may be used to fabricated each fillo-leaf circuit layer 2 provided the switchable devices and circuits are disposed in insulated spaced relationship with it.

Figure 4:
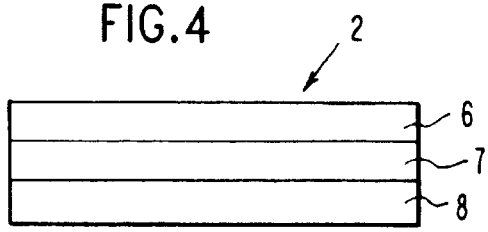
FIG. 4 is a cross-sectional view of a fillo-leaf circuit layer contained within the MFT module of FIG. 3.

For exemplary purposes only, the fillo-leaf circuit layers 2 shown and described herein will be considered to be made of silicon elements which contain logic and memory devices and circuits utilized in the operation of electronic computers. As shown in FIG. 4, each fillo-leaf circuit layer 2 includes a circuit layer portion 4 approximately 5 $\mu$m–10 $\mu$m thick in which the active circuit areas are disposed. Another portion of each fillo-leaf circuit layer 2 is a substrate portion 7 which acts as a mechanical support to resist breakage during handling. Circuit layer portion 6 is provided with one or more active circuit areas in the form of logic circuits or memory arrays or both already formed on one surface of the semiconductor wafer. The circuit designs for each of the semiconductor wafers are such that all desired connections, whether input, output, power transmission, address or control lines, are brought to an edge 3 of each fillo-leaf circuit layer 2 when the wafers are diced during the fabrication process hereof. This edge 3, together with the edges 3 of a plurality of fillo-leaf circuit layers 2, will ultimately be bonded together in a stack to form a major portion of MFT module 1.

In addition to the active circuit areas, each fillo-leaf circuit layer 2 contains a MSA comparator which, as indicated hereinabove, is used to provide activation signals to one or more circuit areas on each of fillo-leaf circuit layers 2. In addition, the underside of the wafer substrate accommodates a thin copper layer 8 shown in FIG. 4 which may have a waffle-iron morphology to conduct heat generated in the circuit areas to a coolant medium. This well known expedient is utilized because copper has a higher thermal conductivity than that of silicon. Indeed, any appropriate material such as diamond, which has a higher thermal conductivity than silicon and is compatible with semiconductor processing, may be utilized for this purpose.

As will be described in greater detail hereinafter, each fillo-leaf circuit layer 2 thinned wafer is realized from a semiconductor wafer which is thinned using well-known chemical-mechanical polishing or other techniques known in the art. Each thinned wafer is flexible, but is not so thin that handling during future processing is not possible. Once the desired thickness of substrate portion 7 has been reached, the semiconductor wafer is subjected to an insulation layer deposition process. Then, a copper deposition process is used to form a deposited layer of copper 8 on the insulation layer (not shown in FIG. 4) applied to the substrate portion 7 of each wafer. The thickness of copper layer 8 is not so thick that the flexibility of a fillo-leaf circuit layer 2, when diced from a thinned wafer, is compromised. Copper layer 8 may be subjected to further processing using photolithographic and etching techniques in order to increase the surface area of layer 8, thereby improving thermal management (i.e. cooling) of MFT module 1. One approach which increases the surface area of copper layer 8 is illustrated in FIG. 10. The process involves: depositing a layer of insulation onto the thinned substrate 7, as shown in FIG. 10A; depositing a layer of copper on the underside of a semiconductor wafer as shown in FIG. 10B; forming masked areas as shown in FIG. 10C; depositing copper 81 over exposed and masked areas as shown in FIG. 10D; and lifting-off (i.e. removing) the masked area masks as shown in FIG. 10E. This process leaves a copper film 8 having a waffle iron-like shape which has a larger cooling surface.

Where each fillo-leaf circuit layer 2 is made of a material such as sapphire and the circuit devices are disposed on a surface of the sapphire, there is no circuit layer 6 as such, but only a substrate portion 7 which comprises fillo-leaf circuit layer 2. In this situation, fillo-leaf circuit layer 2 would be created by subjecting the parent wafer to a chemical-mechanical polishing and forming a heat dissipating layer on each thinned wafer prior to wafer stacking and aligning operations. In this case, the resulting fillo-leaf circuit layers 2 would be flexible. However, if desired, the present wafer (s) need not be thinned and the resulting fillo-leaf circuit layer 2, relative to a flexible one, would be rigid in structure.

Figure 5:
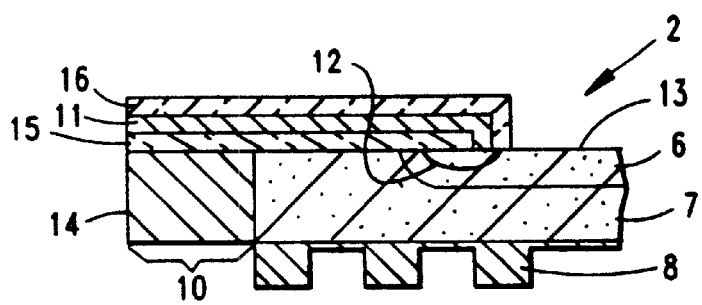
FIG. 5 is a cross-sectional view of a portion of a fillo-leaf circuit layer, showing a conductive line extending from an active circuit device formed thereon, disposed in an insulated spaced relationship with the surface and radiation-transparent edge portion of the fillo-leaf circuit layer.

Referring now to FIG. 5, there is shown a cross-sectional view of a portion of a fillo-leaf circuit layer wherein a conductive line extends from an active circuit device in an insulated spaced apart relationship with the surface and radiation-transparent edge portion of fillo-leaf circuit layer. As shown in FIG. 5, fillo-leaf element 2 includes a circuit layer 6, a substrate portion 7 and a layer 8 made of copper having a waffle iron-like morphology using the process illustrated in FIGS. 10A–10E. In addition, each fillo-leaf circuit 2 includes a radiation-transparent edge portion 10 which is an oxidized portion of fillo-leaf circuit layer 2 and has substantially the same thickness thereas. In FIG. 5, a conductive line 11 extends over a semiconductor region 12 over a surface 13 of fillo-leaf circuit layer 2 and terminates on the outer edge 14 of radiation-transparent edge portion 10. Line 11 is insulated from surface 13 by a layer 15 of silicon dioxide or other appropriate insulating material. Layer 15 extends over radiation-transparent portion 10 and, like line 11, terminates at outer edge 14. In a similar way, passivation layer 16 extends from semiconductor region 12, over line 11 and terminates at outer edge 14. Radiation-transparent edge portion 10 is conveniently made from silicon dioxide which may be grown at the wafer level (preferably prior to wafer thinning) by masking the underside of the wafers and subjecting the exposed portions thereof to an oxidizing atmosphere while heating to provide oxidized regions in the wafer. When the wafer is diced, the oxidized regions will function as radiation-transparent edge portions 10 for fillo-leaf circuit layers 2.

The dicing of a stack of thinned wafers to form fillo-leaf circuit layers 2 is accomplished in a manner well-known in the art and does not provide a smooth, planar edge 14 like that shown in FIG. 5. To the extent outer edge 14 is not of a desired smoothness and planarity, this will be taken care of after a plurality of fillo-leaf circuit layers 2 are stacked, aligned and bonded. At that point, as will be described below, outer edges 14 are polished to provide a surface sufficiently planar to provide interconnections between pairs of conductive. lines 11 on the same fillo-leaf circuit layer 2, (i.e. local wiring), or between conductive lines 11 on different fillo-leaf circuit layers 2, (i.e. global wiring) on the same stack that are much longer, as shown in FIG. 8E.

Figure 6:
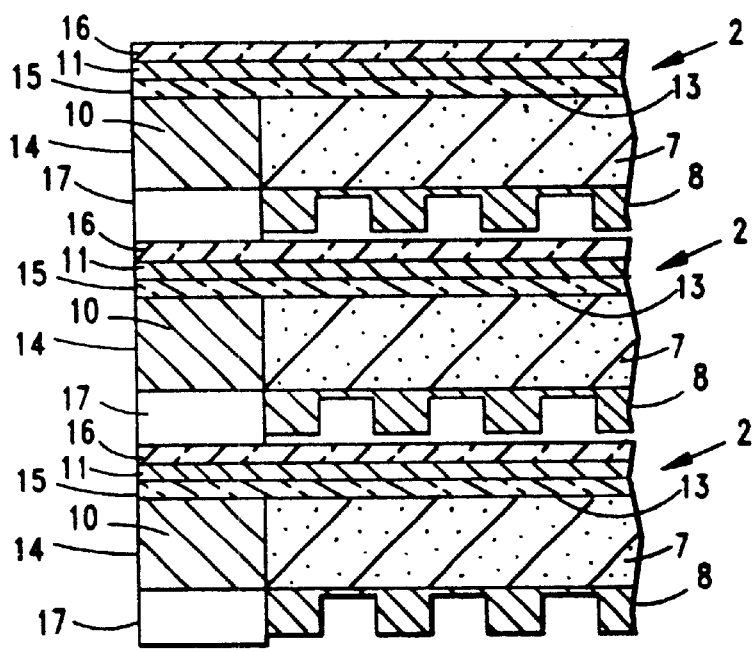
FIG. 6 shows a cross-sectional view of a plurality of fillo-leaf circuit layers of the type shown in FIG. 5, arranged in a stack formation.

In addition to providing an insulating surface on which thin-film interconnections may be made locally and globally, radiation-transparent edge portions 10 perform a key function during fabrication by acting as transparent regions or windows which allow electromagnetic radiation, e.g. UV light or IR radiation, to be transmitted therethrough in order to cure a bonding material disposed between edge portions 10 when the thinned wafers are stacked and aligned during the fabrication process. FIG. 6 shows a stacked assembly of fillo-leaf circuit layers 2 which incorporate both the radiation-transmission windows 10 and radiation curable material 17. Notably, radiation-transparent edge portions 10 may contain solder bump connection points, from which conductive lines may extend to circuit areas or memory arrays to permit circuit testing. Circuit testing would be carried out on the wafer level prior to dicing.

While not specifically shown in FIG. 5, it should be appreciated that circuit layer 6 may contain logic circuits or memory arrays made up of active circuit devices like transistors, diodes and the like. More specifically, bipolar circuits and low-power circuits incorporating CMOS devices may be utilized. Also, well-known memory arrays incorporating one-device memory cells may be utilized in forming such arrays in fillo-leaf circuit layers 2. Also while only a single conductive line 11 has been shown in FIG. 5, it should be appreciated that a plurality of conductive lines terminate at outer edge 14 and that these lines function to encode each fillo-leaf circuit layer 2 with its own unique address; receive address information from address lines; and bring data and power to the addressed fillo-leaf circuit layer 2.

FIG. 6 shows a cross-sectional view of a plurality of fillo-leaf circuit layers similar to that shown in FIG. 5, except they are arranged in an aligned and bonded stack. Once the wafers have been processed as described above to form fillo-leaf circuit layer elements 2, they are stacked, spaced, aligned and bonded so that the ends of conductive lines disposed at edges 3 such as address lines and encodable address lines may be placed in precise alignment.

Fillo-leaf circuit elements 2, which may be characterized as module subassemblies for module assembly 1 shown in FIG. 5, are identical to the fillo-leaf circuit layers shown in FIG. 5 except that the active devices in their circuit areas 6 may form logic circuits, memory arrays or combinations of both. In FIG. 6, bonding material (e.g. UV-curable adhesive) 17 extends between the bottom of each UV-transparent edge portion 10 and the top of passivation 16 on the adjacent underlying circuit layer element. In FIG. 6, bonding material 17 has a rigid form and is bonded to UV-transparent edge portions 10 and passivations 16 in such a way that the unoxidized portions of circuit layer elements 2 extend in a cantilevered fashion from bonding material 17. The passivations 16 are in registration with their overlying radiation-transparent windows provided by UV transparent edge portions 10. As will be explained in greater detail hereinafter, when each thinned wafer is stacked upon another, the bonding material 17 (e.g. UV-curable adhesive such as DYMAX) is disposed between a pair of thinned wafers. Then, when the wafers are properly aligned with respect to a common fixed reference position, ultra-violet (UV) light is beamed through radiation-transparent edge portions 10 acting as "windows" and the UV curable adhesive material 17 in registration with UV-transparent portions 10 becomes rigid (i.e. fixed) while bonding to the edge portions 10 of fillo-leaf circuit layers 2. Since the bonding material outside of radiation-transparent edge portions 10 is masked by copper films 8, bonding material at such locations is not cured when exposed to UV light. Thus, such bonding material may be washed away leaving cured bonding material 17 intact. To the extent that conductive lines 11 also shadow the UV curable adhesive material, this is not a problem because the lines are thin enough that the curing UV light is scattered enough to permit the whole of bonding material 17 to be cured at regions in registration with radiation-transparent edge portions 10. If line thickness creates a problem during curing, then the UV curing light may be obliquely beamed through UV transparent end portions 10 in order to insure proper curing of bonding material 17. During stacking, the thickness of the UV curable material is adjusted so the bottoms of thin metal films 8 do not touch passivations 16 beneath them. There should be sufficient spacing between elements 2 to permit the flow of a cooling fluid between elements 2. This is particularly true when circuit layer elements 2 are rigid. In a flexible regime, spacing is less important because circuit layer elements 2 are sufficiently flexible to move apart under coolant flow conditions. Contact between portions of fillo-leaf circuit layers 2 would, in any event, do little damage because, at worst, metal would always contact passivation 16 or insulation.

Prior to bonding, testing of circuits in circuit areas 6 of thinned wafers may be carried out at the wafer level, using solder ball interconnections on radiation-transparent edge portions 10 and test interconnections which apply test routines to the various circuit areas to exercise their functions. It is, at this point, that information relating to the operability of each fillo-leaf circuit layer 2 is required so that appropriate coding (by local thin-film wiring) can be provided on the polished edge 14 of each bonded stack of fillo-leaf circuit layers after they are diced into MFT stacks. It should be appreciated that, even though totally inoperable fillo-leaf circuit layers 2 are included in a MFT stack, the performance of the overall MFT module will not be significantly degraded thereby, by virtue of the fact that encoding each fillo-leaf circuit layer 2 makes it possible to select or avoid any fillo-leaf circuit layer 2 in a MFT stack.

When testing and bonding have been carried out, the stacked/thinned wafers are subject to a dicing step which provides a stack of fillo-leaf circuit layers 2 like that shown in FIGS. 3, 6. Multiple stacks of fillo-leaf circuit layers 2 may be produced by slicing at end portions 10 permitting a plurality of stacks to be connected together via an interconnection cable 4.

Once stacks of fillo-leaf circuit layers 2 have been produced by dicing, outer edges 14, cured bonding material 17, passivations 16, oxides 15 and lines 11 of such stacks are subjected to a chemical-mechanical polishing step, in a well-known way, to bring these elements to the same surface level. In this way, a substantially planar surface is provided with the ends of lines 11 being exposed so that local and global interconnections among fillo-leaf circuit layers 2 can be made. These interconnections may be formed by masking and etching a deposited thin-film of metal in a well-known way on outer edges 14 which are insulating in character.

Electrical contact is made directly to lines 11 during deposition. Otherwise, an oxide layer may be deposited using a mask such that lines 11 and other areas are masked. When the mask is removed, vias 60 remain, s shown in FIG. 8C, to which solder balls 60A are formed. Thin film interconnections are then deposited on the outer edges 14. As will be shown in connection with FIGS. 7 and 8C, such thin-film interconnections include shorting straps 31 which encode each fillo-leaf circuit layer 2. Then, flat interconnection cable 4, as shown in FIGS. 3 and 8C, may be connected to the solder balls on outer edges 14 via corresponding solder balls 60A on the surface of interconnection cable 4.

Figure 7:
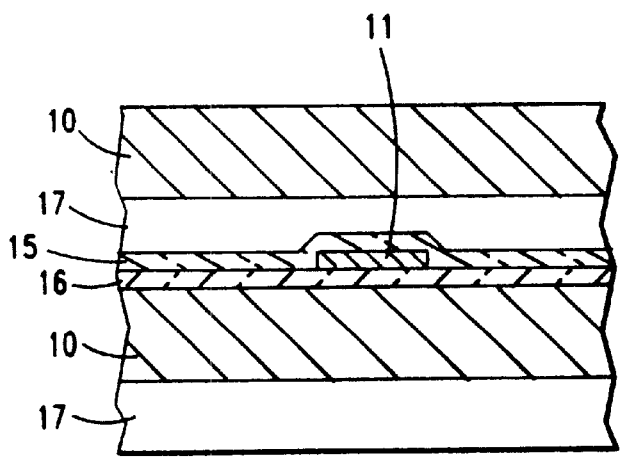
FIG. 7 is a cross-sectional view through edge portions of FIG. 6 showing a conductive line and a cured bonding material sandwiched between a pair of radiation-transparent edge portions.

FIG. 7 is a cross-sectional view taken through radiation-transparent edge portions of the packaging assembly of FIG. 6 showing a conductive line and cured bonding material 17 sandwiched between a pair of radiation-transparent edge portions 10. FIG. 7 shows radiation-transparent edge portions 10 extending over lines 11 and cured bonding material 17 conforming to the topology of the surface on which it is placed. In this instance, the surface is that of passivation 16 which itself is conformal with line(s) 11 over which it passes. In FIG. 5, the end of conductive line 11, by virtue of a chemical-mechanical polishing step, is bare and surrounded by insulation in the form of oxide 15 and passivation 16.

As shown in FIG. 8E, local wiring is produced by forming thin-film wiring on the polished edge surface 14, in order to connect conductive lines 11 on the same fillo-leaf circuit layer 2. Global wiring is provided by forming thin-film wiring on polished edge surface 14 in order to connect conductive lines 11 on a selected fillo-leaf circuit layer 2, to conductive lines 11 on fillo-leaf circuit layers 2 above and below the selected one, as shown in FIGS. 8A and 8E. As will be described below, the ability to provide local wiring enables encoding each fillo-leaf circuit layer 2 with a unique address code which permits the selection of that fillo-leaf circuit layer 2 from hundreds or even thousands of such fillo-leaf circuit layers 2 within a MFT module using a minimum number of wiring connections. This IC Chip Selection/Addressing scheme will now be described below in conjunction with FIGS. 8 through 8E.

FIG. 8B is a partially schematic top view of a fillo-leaf circuit layer 2 showing pairs of encoder lines 20, 21 and address lines 22 extending from the outer edge of a fillo-leaf circuit layer to a MSA comparator circuit represented by block 29. Each fillo-leaf circuit layer (which may contain logic circuits or memory arrays) is shown disposed in a circuit layer and conductive lines which carry data, power and other required information are shown extending from the outer edge of the fillo-leaf circuit layer to the circuit layer. FIGS. 8A and 8E shows a side-views of a plurality of fillo-leaf circuit layers which indicates how each fillo-leaf circuit layer is uniquely encoded.

While fillo-leaf circuit layers 2 in FIG. 8, are exactly like those shown in the previous figures, certain details have been removed to simplify the following explanation. The edge has been shown to provide a positional reference for the top view and only conductive lines 11 have been shown in the side view to clearly show the encoding of pairs of encoder lines on outer edges 14 of fillo-leaf circuit layers 2. Also to distinguish the encoder lines from address lines and from data and power transmission lines and all three from conductive lines 11, each of the different lines will be shown in what follows by different reference numbers. Thus, lines 20, 21 are pairs of encoder lines, lines 22 are address lines and lines 23 are data and power transmission lines. Circuit area 6 is shown in fillo-leaf circuit layer 2 as a block. It should be appreciated that this layer may be comprised of logic circuits, memory arrays or combinations of both. However, whatever the combinations may be, all lines servicing each fillo-leaf circuit layer 2 will extend to outer edge 14 of each fillo-leaf circuit layer 2.

Considering now the top view of a fillo-leaf element shown in FIG. 8B, pairs of encoder lines 20, 21 are shown extending from edge 14 of fillo-leaf 2 over edge portion thereof 10. Line 20 of each pair is shown connected to the gate electrode 24 of an associated field effect transistor 25. Line 21 of each pair is shown connected to a power source 26. A drain electrode 27 of each transistor 25 is connected to ground and a source electrode 28 of each transistor 25 is connected to a comparator circuit indicated in FIG. 8B by block 29. An output line 30 extends from comparator block 29 to circuit area 6. Line 30 provides an enabling or selection signal which activates either the logic circuits or memory circuits in area 6 when an address sent to all fillo-leaf circuit layers 2 coincides with the coding on a fillo-leaf circuit layer 2.

As shown in FIG. 8A, coding is accomplished by applying or not applying shorting straps, i.e. thin-film local wiring, 31 across pairs of encoder lines 20, 21 during the metallization of outer edges 14 described in FIG. 6. In FIG. 8A, shorting straps 31 are shown connected in the top view across the first and third pairs of encoder lines 20, 21 from the top on outer edge 14. Note that the second and fourth encoder lines 20, 21 from the top are left open. Shorting straps 31 connect power to gates 24 of the first and third transistors 25 from the top, activating them and permitting current to flow to selected devices in a comparator circuit 29. This coding is permanent and different for each fillo-leaf circuit layer 2 and transistors 25 may be powered from either a fixed or clocked source of power. Then, when address signals are applied to all fillo-leaf circuit layers 2 in parallel via address lines 22, the address signals are conveyed to comparator 29 where, if a match between the coding signals of a fillo-leaf circuit layer 2 and the address signals occurs, an enabling signal will be sent via line 30 to circuit area 6. In FIG. 8A, if a strapped pair of encoder lines 20, 21 represents a digital "1" and an unstrapped pair a digital "0," the code for fillo-leaf circuit layer 2 in view of FIG. 8A is 1010. If the address on address lines 22 is also 1010, then a comparison will be made and an output will appear on line 30.

FIG. 8A shows the side view of a stack of fillo-leaf circuit layers 2 which are bonded together at their radiation-transparent edge portions 10 and present their outer edges 14 in the plane of the paper. The rightmost column of pairs of encoder lines 20, 21, shown in side view, correspond to the pairs of encoder lines 20, 21 shown in the top view of FIG. 8B. Shorting straps 31 in the side view in the rightmost column also correspond to straps 31 in the top view providing the coding 1010. The leftmost column shows straps 31 shorting all the pairs of encoder lines 20, 21 providing a code of 1111. The middle column straps 31 shorting all encoder lines 20, 21 but the second from the top, provide a code for its associated fillo-leaf circuit layer 2 of 1011. When address lines 22 carry the address signals 1011, MSA comparator 29 on that fillo-leaf circuit layer 2 will provide an output on its associated line 30 activating its associated circuit area 6.

While lines 23 have been characterized as data and power transmission lines, it should be appreciated that these lines are the ones that carry input and output data, x, y selection and the like. Address lines 22 are global in character since they are connected to more than one fillo-leaf circuit layer 2.

Address lines 22 must be connected to all fillo-leaf circuit layers 2. Shorting straps 31, since they interconnect conductive lines 11, like pairs of encoder lines 20, 21, in the same fillo-leaf circuit layer 2, may be characterized as local wiring. In a more general sense, wiring may be characterized as global, regardless of the number of fill-leafs 2, it extends over, if it is over 10 mm in length. If it is less than 10 mm, specifically 10014 µm, it may be characterized as local wiring. Local wiring of these short lengths may be deposited directly on the polished edge portions 14 while global wiring, may require other approaches since it must have adequate signal propagation characteristics to retain the TEM mode.

The MSA of the present invention makes it possible to randomly select and access any fillo-leaf circuit layer 2 for carrying out reading and/or writing operations. This is made possible by providing each fillo-leaf circuit layer 2 with a unique identity (i.e. address) by the "local" thin-film wiring connections described above. The MSA of the present invention makes it possible to give a unique address to each circuit layer by means of a single wiring mask at the end 14 of the MSA module. FIG. 8E shows the polished edge 14 of a MFT on which interconnect thin-film wires are deposited. In FIG. 8E, only a few connections are shown for clarity. For example, the FL 53 is connected to FL 54 (a) by local wiring, while in (b) two wires in the same layer FL 53 are connected by local wiring and, finally, in FL 53 is connected to FL 622 by global wiring. On the other hand, wiring connection (c) between FL53 and FL622 is over 10 mm in length and thus shall be characterized as "global" wiring. Global wiring must have adequate signal propagation characteristics to retain TEM mode, hence simple connections are inadequate.

Referring to FIGS. 8A and 8B, the operation of the MSA will now be explained. In FIG. 8A, a portion of the MFT module in the top of the FIG. 8 is magnified, revealing the side view of four layers (n,n+1, n+2 and n+3). Also in FIG. 8B, the top view of the nth layer is revealed, showing the layer consists of a conventional memory array along with a special circuit comprising MSA comparator 29, which compares the "Layer Select Address" (22) with the "Layer Identification Code" (20, 21) as shown in FIG. 8B. This code is created by a single metallization layer at the end of the processing steps. Notably, in FIG. 8A, each of the four fillo-leaf layers has a different code. The MSA comparator 29 receives a bit pattern from the Layer Identification Code inputs and compares this pattern with the Layer Select Address. If a match is found, the enable signal is transmitted from MSA comparator 29. Notably for each bit, there is a pair of wires. One wire is connected to the input of the transistor and the other wire is connected to the power line. When a pair of wires is shorted by the thinfilm metallization layer deposited at the edge 14, it represents "1" state. When a pair of wires is left open, it represents the "O" state. In the example shown, therefore, the nth layer has a code of 1010 (created by the local metallization) and to select it, we need to send Layer Select Address of 1010 to the comparator. The n+1 and the n+2 layers have respectively different codes, 1011 and 1111. This addressing architecture makes it easy and inexpensive to give unique addresses to a large number of fillo-leaf circuit layers in an MFT module. In general, each MFT module has $2^N$ layers, however, only N Layer Select Address lines are needed as input to the MSA comparator. This serves to minimize the total number of interconnects, making it feasible to contemplate a PB memory.

The MSA architecture of the present invention makes possible massive layering of thousands of IC chip layers to produce the MFT module and interconnect such layers with a minimum number of lines. The alternative to the MSA concept would have been to assign a line for each fillo-leaf circuit layer. This approach is not workable when the number of fillo-leaf circuit layers of is 10,000 and beyond. Another alternative minimizes the number of lines, but requires that each layer be coded separately with a unique address. This approach, too, is very costly since one would require tens of thousands of independent operations to code each layer. With this perspective, the MSA architecture of the present invention is the preferred approach since it enables the stacking of tens of thousands of fillo-leaf circuit layers without the need for costly process steps, nor a large number of lines. For instance, a single metallization at the edge of the MFT stack producing 32 layer-select lines, allows the interconnections of 4.3 billion layers.

The MSA architecture of the present invention also makes it possible to optimize yield and optimize testing for the overall manufacturing process. If an MFT assembly as shown in FIG. 3 is to be fabricated, the MSA hereof permits a fillo-leaf circuit layer to contain "bad" arrays, as each "good" array is assigned its specific function after manufacturing. In effect, each manufactured MFT assembly is customized to not access "bad" arrays. The choice of array size is directly related to testability. A very large logical array can entail excessive test time. Because of the MSA of the present invention, the array size can be chosen to optimize yield and test time.

The MFT architecture of the present invention exhibits novel thermal flow characteristics, by virtue of the fact that between fillo-leaf layers, copper depositions will absorb the heat and allow them to be transferred to the coolant. Also, the fillo-leaf circuit layers are separated with increased coolant flow, much as the pages of a book can be separated with an air flow. Also, while FIG. 3 shows a flexible cable 4 connected to these top wirings, any external connection, including a module with various other combinations permitted for extra connections, is possible.

The Fabrication Process of the Present Invention

Step 1.: Wafer Modifications

Figures 9E, 9F:
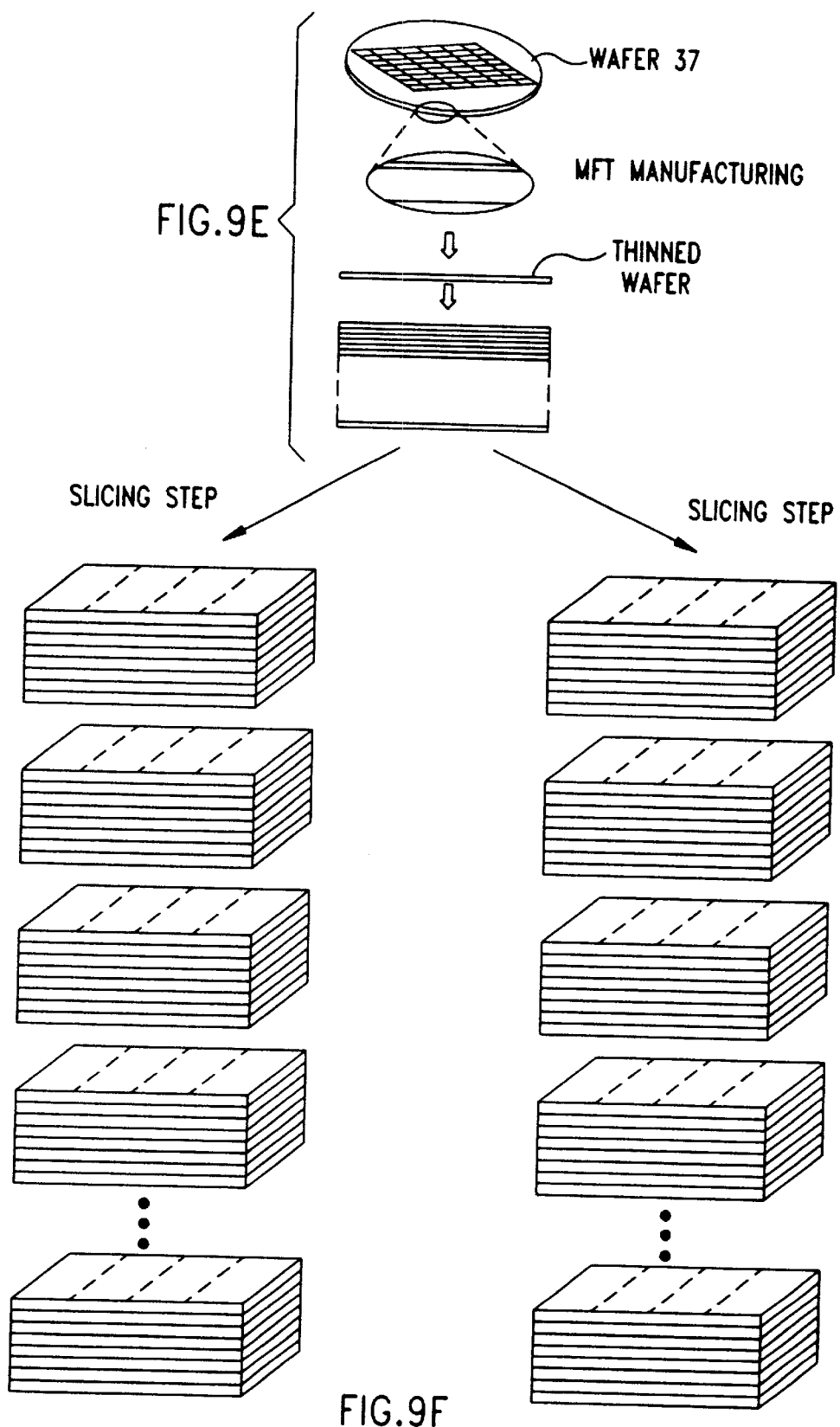
FIG. 9A is a schematic diagram illustrating the steps involved in carrying out the illustrative embodiment of the fabrication method of the present invention.
FIG. 9B is a schematic diagram illustrating a process of stacking multiple MFT modules of the present invention to produce MFT modules having higher information storage capacities on the order of Peta-bype performance.

As indicated at Block A in FIG. 9A, fabrication of the MFT module 1 shown in FIG. 3 begins by producing 500 µm thick semiconductor (e.g. silicon) wafers 38. Each wafer can be fabricated using techniques well-known to those skilled in the semiconductor arts. The fully processed and tested wafer 38 has a plurality of IC chips, each having appropriate logic circuits, memory array(s) and other circuit elements formed in semiconductor circuit areas 6 which carry out memory, MSA functions of the present invention, and other functions well known in the art. Notably, each IC chip on the wafer is provided with the novel MSA circuit 29 of the present invention which has been described in detail hereinabove. Each wafer consists of an active useful circuit layer (CL) which is typically less than 10 µM thick disposed on top of the rest of the substrate of about 500 microns thick which serves primarily as a mechanical support.

During wafer fabrication, each IC chip has its signals, power, and ground connections formed at one edge only within the wafer. This in marked contrast with conventional methods, wherein each IC chip on a wafer 37 is normally connected to its next packaging level across the area of the chip surface. Also, as shown in FIG. 8D, there is a passive area 16 on the integrated circuit chip, wherein no circuitry exists and, hence, no heat is generated. This "thermally" passive area 16 corresponds to the bonding edge of the fillo-leaf circuit layers. Along such passive areas, there will be no heat to dissipate, and hence the edge bond at such passive areas is not expected to created any metallurgical problems. At the edge of the passive section, connections may be built up with additional metal to permit wafer testing and to subsequently permit a better connection to the thin-film wiring formed on the polished bonded edge surface during subsequent stages of the fabrication process, to be described in detail hereinbelow.

Preferably, at stage A, radiation-transparent edge portion 10 in each IC chip region is realized at stage A of the fabrication process in the manner described hereinabove. To minimize slicing operations, back to back IC semiconductor regions can be oxidized so that a single slicing operation forms radiation-transparent edge portions 10 on two stacks of bonded fillo-leaf circuit layers 2. Alternatively, radiation transmissive regions 10 can be provided within each IC chip (at its passivation region) by etching holes completely through the wafer to provide windows for IR or UV radiation required to cure patterned adhesive applied to the wafers during the wafer bonding stage.

Notably, where bonding will occur, there are no (electrically-active) circuits in the passive area 16 of each fillo-leaf circuit layer formed on the wafer, as shown in FIG. 8D. However, there are metal lines extending to the edge of the fillo-leaf circuit layer, as shown. The radiation-transparent edge portion 10 in the passive area will permit UV (or other types of) radiation to pass therethrough during curing the adhesive between aligned thinned wafers, freezing them into wafer position.

In MFT modules of the present invention, a single wafer can contain many different functional units all of which must be precisely aligned with respect to each other on the wafer. Wafer testing will also require a tester that can verify the wafer for more than one functional unit. At this stage of the fabrication process, alignment marks 44 shown in FIG. 12 will be placed on fabricated wafers to form common fixed reference points thereon, for use during subsequent wafer alignment procedures, depicted in FIG. 11. These alignment marks will have both coarse and fine features to permit alignment of final (thinned) wafers to less than 1 $\mu$m precision.

Step 2: Thinning and Handling of Wafers

During the next step in the fabrication process indicated at Block C in FIG. 9A, each wafer is thinned by removing the silicon substrate using automated chemical-mechanical polishing and etching (or other) techniques applied to the underside of each wafer so that the final thickness of the thinned wafer is approximately 10 microns or less. An etchant such as HF may be used in this chemical-mechanical polishing step. The upper surface of each wafer is appropriately masked to protect solder in via holes, for example, which are present to permit circuit testing at the wafer level. Glass trenches, or like structures, formed within thinned wafer substrate can be used to control the resultant thickness of the wafer substrate to a tolerance of about 0.5 $\mu$m. During this step of the fabrication process, special vacuum holders can be hold the wafer during thinning operations.

After the wafer has been thinned at Block C in FIG. 9A, a copper layer 8 as shown in FIG. 10A is deposited on the underside of each thinned wafer 38 and processed as shown in FIGS. 10B–10E and described hereinabove to give it a waffle iron-like shape for heat dissipation purposes. Prior to such steps, the oxidized semiconductor regions on the wafer, which will form radiation-transparent edge portions 10 in fillo-leaf circuit layers 2, are masked to prevent deposition of copper to the their undersides. This is an important step in that it ensures radiation-transparency of transparent edge portion 10 when the thinned wafers are stacked together.

Apart from its heat dissipation function, the deposited copper layer 8 functions as a mask when ultra-violet light (or other adhesive curing radiation) is projected through its UV-transparent end portion 10 during the wafer bonding stage. During this wafer bonding step, bonding material is flowed between pairs of fillo-leaf circuit layers 2. Thus, some provision must be made to prevent curing of the bonding material in areas outside radiation-transparent edge portion 10 of each IC chip. The copper film provides this additional masking function, the preventing curing of adhesive in all areas except the transparent edge portion is of each IC chip. Where the thinned wafers are not radiation-transparent, the copper film functions only as a heat dissipating structure.

Step 3: Stacking of Thinned Wafers and Alignment of Fillo-leaf Circuit Layers Formed Thereon In the next step of the fabrication process indicated at Block D in FIG. 9A, the thinned wafers 39 are aligned, stacked and bonded in serial fashion until the desired number of wafers are stacked. Preferably, alignment of the thinned wafers will involve the use of the Fillo-Leaf circuit layer Alignment Robot (FLAR) illustrated in FIGS. 11 and 12. As shown in FIG. 11, the FLAR 40 has an arm 41 of adjustable length and a Transparent Vacuum Chuck (TVC) 42 mounted at the end of the arm. The arm 41 can be rotated to three stations indicated as A, B and C. As the length of the FLAR arm is adjustable, the TVC 42 can assume any (x,y) position over any of one of the three stations.

Figure 12:
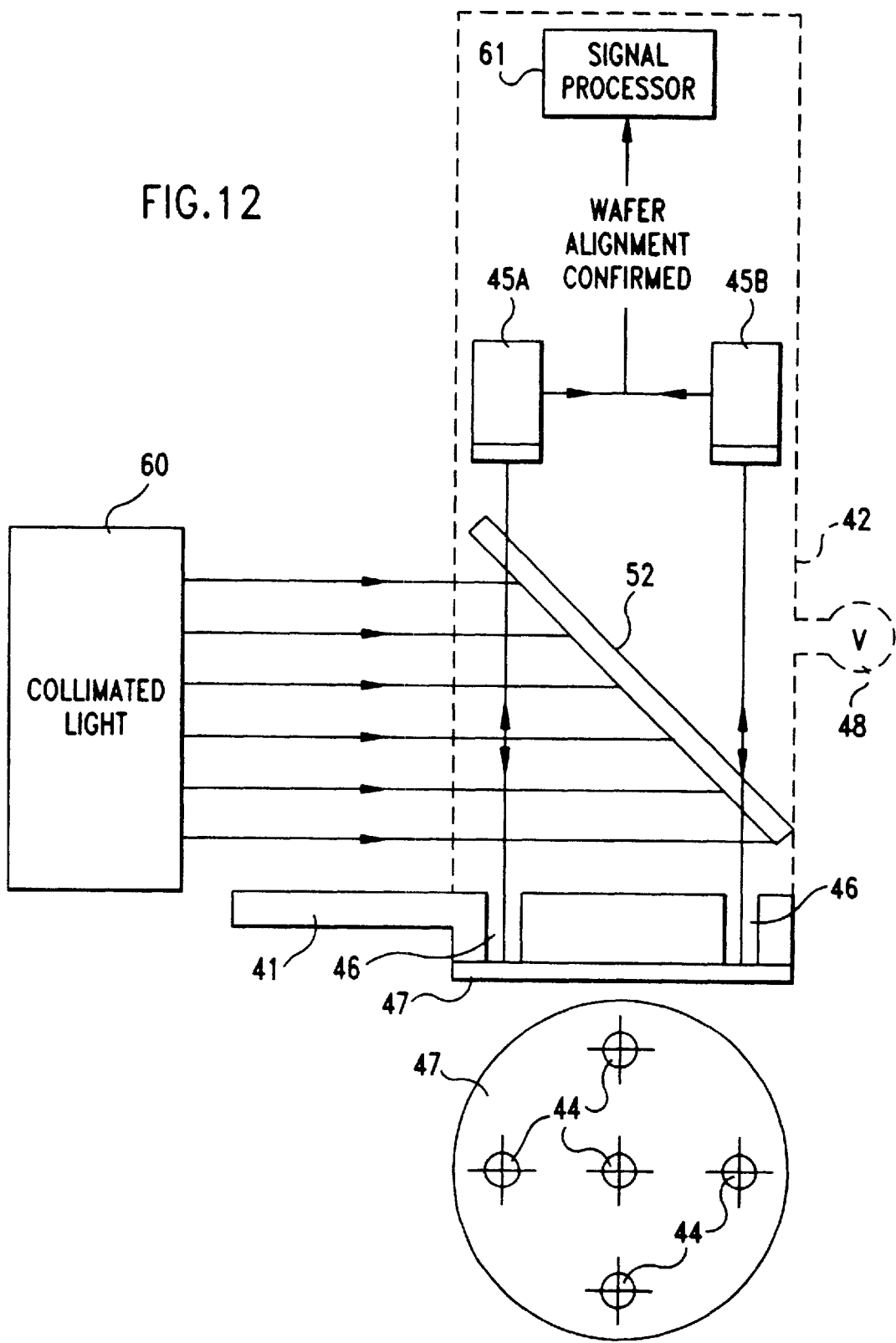
FIG. 12 is a schematic diagram of apparatus for automated alignment of thinned wafers during the stacking stage of the fabrication process of the present invention.

At station A, there is a stack 43 of thinned wafers 39 which can be rotated and moved up or down. At station A, the TVC 42 is positioned over the stack of thinned wafers on top of station A, and sensors (e.g. 45A and 45B) in the TVC 42 will seek alignment marks 44 on the wafer 39, so that the alignment holes in the TVC 42 are directly over the wafer alignment marks 44. By rotating the stack and also moving it up and down, the TVC can be positioned properly over the wafer so it will be acquired by the TVC, as shown in FIG. 12. The only accuracy required at station A is that the wafer alignment marks 44 shown in FIG. 12 are viewable through the holes 46 in the TVC 42. Once alignment is achieved, the vacuum 48 is applied to the TVC, acquiring the new thinned wafer. The FLAR arm 41 is then rotated to station B, where the bottom of the new thinned wafer is sprayed with a special UV-curable adhesive from adhesive applicator 49 which will be subsequently cured at stage C.

At stage C, UV-fixable conformal (adhesive) coatings, such as DYMAS Line 84F and DYMAX Line 84LVF, commercially available from DYMAX Corporation, may be used during these stages of the fabrication process.

The FLAR arm 41 is then moved to station C. At this stage, all new thinned wafers will be aligned to single fixed reference (specified within coordinate system symbolically embedded within the FLAR system). This will ensure that there can be no cumulative buildup of wafer alignment error as large numbers of new thinned wafers are stacked up during subsequent handling/alignment operations. This use of a single fixed reference is critical during this stage of the fabrication process.

The operation at station C is detailed in FIG. 12. At station C, the stack of wafers 50 can be rotated very accurately and moved up and down very accurately as well. As shown in FIG. 12, the position of the new wafer is tracked by several fixed comparators 51A and 51B vertically arranged on top of the TVC 42 so the 50% of the collimated light projected in a light source 60 to the half-mirror 52 positioned at 45° relative to the acquired thinned wafer, will be reflected vertically downward, vertically illuminating the alignment holes (slots) 46 formed in the TVC 42.

At the very top, the sensors 45A and 45B can view through the half-silvered mirror 52 and monitor the illuminated alignment marks 44 on the thinned wafer disposed below. The matched stationary comparators 51A and 51B and signal processor 61 can detect the alignment marks 44 as a fixed reference, and adjust the new wafer precisely over the aligned stack 50 based on reflected light illuminating the alignment marks 44 on the thinned wafer.

The stack of thinned wafers is rotated, moved up while the arm is positioned until the comparators 45A and 45B and signal processor 61 indicate alignment of the marks 44 and holes 46. Then the stack 50 is moved up, the vacuum 48 to the TVC 42 is reversed, pressing the new wafer on the aligned stack 50 with applied adhesive, locking the new wafer into precise alignment (<1 $\mu$m) with the fixed reference. Before the vacuum pressure is released, and the FLAR arm 41 begins a new cycle, the aligned wafer is exposed to ultra-violet light from source 53 at station C. Notably, at stage C, a portion of the UV light is transmitted via UV-transparent edge portions 10 (on each IC chip on the aligned wafer) onto the light curable adhesive material applied to the bottom of the thinned wafer at stage B. UV exposure is carried out for a time and intensity sufficient to cure the exposed adhesive material.

Notably, appropriate cleaning and degreasing of the thinned wafers 39 will be required to ensure adhesion of the cured material to UV transparent edge portions 10 on each IC chip. The cured adhesive material disposed in registration with the UV transparent edge portions 10 of each IC chip on the aligned wafer provides the cured bonding material 17 shown in FIG. 6.

The foregoing steps are carried out in serial fashion as many times as are required to stack the desired number of thinned wafers. The resulting stacks may include several thousand thinned wafers. After curing has taken place, the vacuum pressure within the TVC is released, and the FLAR arm 41 begins a new cycle.

It must be emphasized that there are many other arrangements and means which can be used to achieve the physical positioning required within the FLAR system 40. Another approach would be to enable the FLAR arm to position up and down as well as rotate, and then allow station A and station C only up and down movement.

Step 4.: Slicing and Polishing of the Bonded Edge of the Fillo-leaf Circuit Layer Stack At this stage of the fabrication process, the wafer stack is sliced into either single sections, or multiple sections as illustrated at Block E in FIG. 9B. Excessive adhesive outside the bonding area will be removed at this stage by techniques well known in the art. Each section will then be polished on its edge so that an MFT stack is metallurgically exposed for the subsequent bonding of thin-film wiring thereto, as illustrated in FIGS. 3 and 8C.

Since the vertically stacked thinned wafers are bonded along the UV-transparent edge portions 10 between adjacent wafers, the stack of wafers can be sliced along selected lines into sections called 3-D MFT modules, as shown at Block E in FIG. 9B. Such sections can be further diced into single MFT modules, as shown in FIG. 3. Each circuit layer in the sliced or diced section is referred to herein as a "fillo-leaf", or "fillo-leaf (FL) circuit layer", because it is flexible, like a leaf which is defined by the word "fillo" in Greek. Each thinned wafer 39 in a diced wafer stack (i.e. MFT module) will contribute a fillo-leaf circuit layer 2 to the MFT module. Notably, the circuitry of each such fillo-leaf circuit layer 2 was formed on the 500 micron wafer at the time of wafer fabrication depicted at Block A in FIG. 9A.

Upon slicing and/or dicing, each fillo-leaf circuit layer or element 2 will look generally like the arrangement shown in FIGS. 8A and 8B. As a result of the dicing operations, outer edges 14 of radiation-transparent edge portions 10 are exposed. As best shown in FIG. 6, outer edges 14 of the stack of fillo-leaf circuit layers 2 collectively form a substantially planar surface with only the tips of interconnection lines 11 being exposed at an otherwise electrically insulating surface. To the extent that outer edges 14 are marred by the dicing process, radiation-transparent edge portions 10 are subjected to a chemical polishing step, by chemical-mechanical or other means, which render outer edges 14 planar and polished. The polishing step also ensures that interconnection lines 11 are exposed for subsequent bonding to thin-film wiring which will be deposited on edge portions 14 at a subsequent stage of the fabrication process, as shown in FIGS. 8C and 8E.

Step 5.: Depositing Thin-film Wiring on the Polished Bonded Edge of the Fillo-leaf Circuit Layer Stack As schematically illustrated in FIG. 8C, thin-film wiring is deposited on the polished bonded edge 14 of the fillo-leaf circuit layer stack (shown in FIG. 6 and described hereinabove), thereby interconnecting the fillo-leaf circuit layers 2 therewith and making external connections (e.g. to flexibly connectors, boards or the like). Before thin-film wiring is deposited on polished edge portion 14, the pattern of chip interconnections 23 will be captured photographically or otherwise stored. There will be some alignment differences, however small, between the various fillo-leaf circuit layers, and also there will be some nonworking IC chips on the thinned wafers. Before thin-film wiring begins, this captured interconnection pattern will be used to generate a mask for a customized wiring pattern which adjusts and accounts for the alignment errors and non-working chips that result during the wafer fabrication/assembly process. Notably, each layer within a bonded stack will be shifted with respect to the other because of alignment problems. Local wiring will cover all the cross-sections of the chip connections and have an irregular pattern to compensate for the alignment errors shown.

Using the custom wiring mask created above, thin film wiring is formed on the polished edge surface 14 by photolithographically masking the polished edge surface 14, depositing a thin layer of metallic film, and etching this metallic film layer using laser beam etching technology to form the various layers. Typically, a number of thin-film wiring layers will be deposited in order to realize the number of interconnections required by the system under design. Automated equipment can be employed to accomplish this process. Typically, each formed pattern of local thin-film wiring will be different for two primary reasons. The first reason is that certain circuit layers will be usable, while other layers will not be usable, due to different "yield impacts" computed during wafer testing operations. The second reason is that each stack of fillo-leaf circuit layers will have alignment error. Local thin-film wiring, deposited using the custom-made wiring mask pattern, will resolve such alignment problems, as well as the MSA identification problem discussed above. Global thin-film wiring may be required to reroute data and/or power signals to usable arrays (i.e. active circuits on fillo-leaf circuit layers). If alignment of the thinned wafers can be achieved with a precision of 1 $\mu$m during Step 3, then only the MSA identification problem will need to be resolve using customized local thin-film wiring patterns.

The first interconnection layer of thin-film metallization deposited on the polished edge 14, except via-holes 60, can be covered with an insulating film. As depicted in FIG. 8C, solder balls 61 are formed within the uncovered via-holes 60A in order to connect the thin film wiring 62 to corresponding solder balls on, for example, an interconnection cable 4. The function of the interconnection cable 4 is to provide all data, addresses and power lines to each of fillo-leaf circuit layer 2 within the fabricated MFT module. To enhance connectability, additional thin-film wiring layers may be formed in insulated spaced relationship over the first interconnection layer deposited on outer surface edges 14. This technique is a well-known in the art and need not be explained here in greater detail. Alternatively, instead of an interconnection cable 4, a plurality of MFT modules 1 may be soldered to cards or boards in order to form, for example, massively parallel data processors or like devices.

Figure 13:
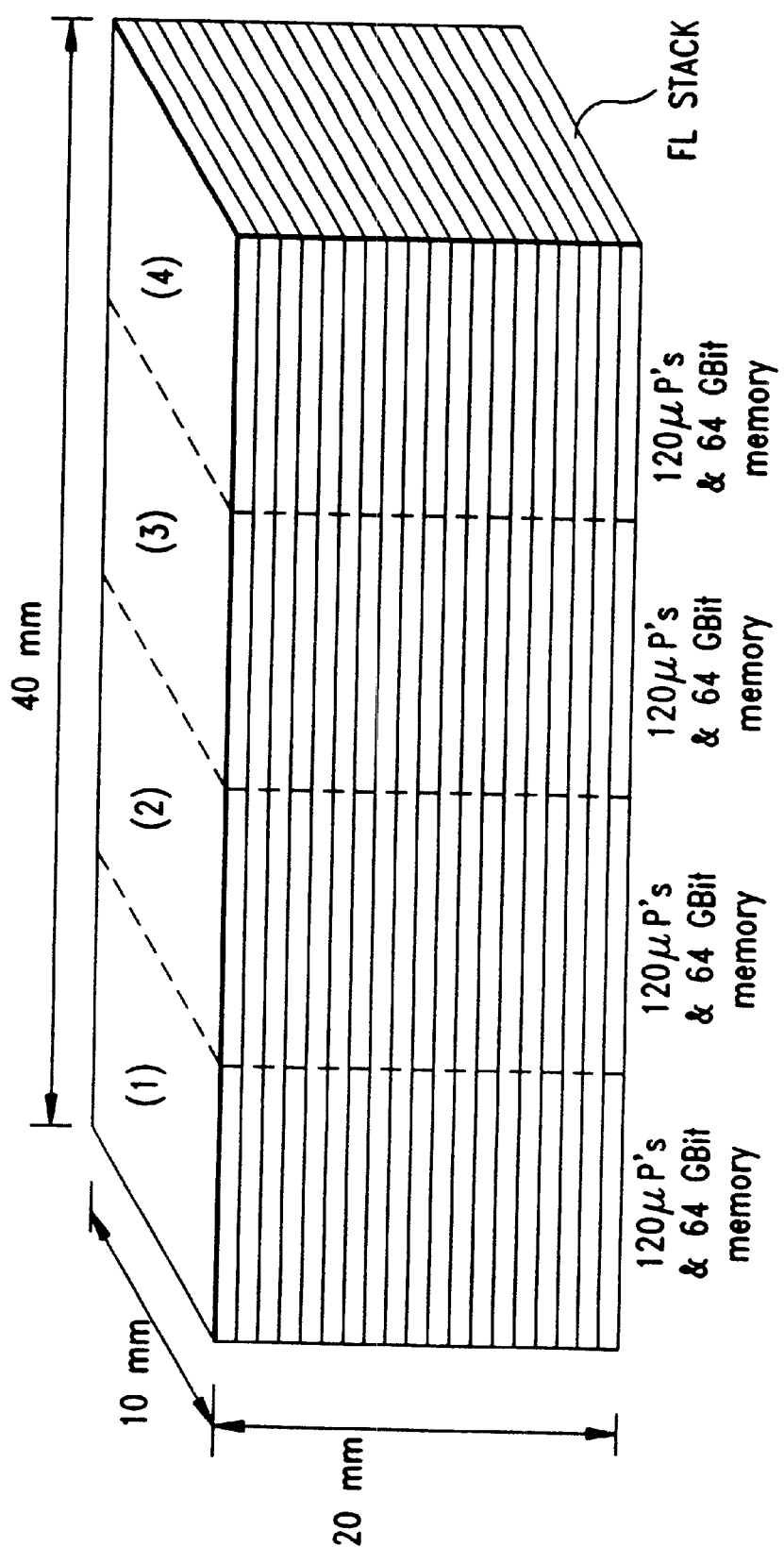
FIG. 13 is schematic diagram of massively parallel computer constructed using a single MFT module.

The above described fabrication process produces a completely fabricated MFT module 1 as shown in FIG. 3, for example, wherein the fillo-leaf circuit layers 2 are flexible in character. In the flexible MFT architecture, the fillo-leaf circuit layers are shown vertically hanging from the top edge which is bonded together. Notably, the fillo-leaf circuit layers 2 can be separated by the flow of coolant because of their flexibility. In FIG. 3, flexible cable 4 is shown connecting the thin film layers 62 to an external I/O. The packaging system of the present invention offer an opportunity for removing heat with improved thermal management, reliability and avoidance of delamination issues. This flexible MFT module is used when many processors are running in parallel, producing large amounts of heat. A MFT memory module will dissipate much less heat, and each such memory module is addressable one memory layer at a time. Consequently, there may not be a need for the flexible module design shown in FIG. 3, and instead, the rigid MFT module shown in FIG. 13 will be used. As shown in FIG. 13, a plurality of 3-D MFT Modules can be packaged to produce TB to PB memories.

In some embodiments of the present invention, it may be desirable to use more than one radiation-transparent edge portion 10 for bonding and ensuring rigidity of a stack of fillo-leaf circuit layers. Thus, for example, in the designs shown in FIG. 13, two opposing edges of a fillo-leaf circuit layer 2 incorporate radiation-transparent edge portions 10. In such embodiments, the fillo-leaf circuit layers 2 must be sufficiently spaced apart to permit the flow of coolant between fillo-leaf circuit layers 2. Such coolant flow is possible by virtue of the fact that uncured or unfixed ultra-violet curable material is removed from between fillo-leaf circuit layers 2 once the curing step has been completed.

The manufacturing steps of the above-described process are referably automated using an infrastructure of special tools described herein.

From the foregoing, it should be clear that fillo-leaf circuit layers 2 may be made, as indicated hereinabove, of many different materials which permit both electrical (i.e. electronic) and optical (i.e. photonic) signals to be used in connection with the high density packaging technology of the present invention. Thus, silicon-on-sapphire, Josephson junctions with silicon and optically switched devices may all be formed into modules 1 without departing from the spirit of the present invention.

In a typical arrangement, a module 1 may contain one-thousand fillo-leaf circuit layers 2 with each fillo-leaf circuit layer 2 having dimensions of 10 mm×10 mm. With each fillo-leaf circuit layer 2 containing four memory arrays storing 16 megabits, the stacks will store (1,000×4×16)=64 Giga-bits in a volume of, for example, 10 cm$^3$ or less.

In FIG. 13, many MFT modules are shown cooperating together for use in high-performance applications.

Typically, the MFT of the present invention will have thinned stacked silicon wafers with alignments of better than 1 $\mu$m. The number of IC circuit layers is expected to be several thousand allowing unprecedented circuit density to be achieved. Compared to any current proposed method, MFT will increase circuit density by a factor of 100 or more.

There are numerous applications for the MFT technology of the present invention. One use might be to use 16 M-bit DRAM technology and build 1,000 layer module which will highlight the MFT power by producing 64 G-bit in a volume less than 8 cm$^3$. Numerous other uses will readily come to mind to those having the benefit of the present disclosure set forth herein.

Having described in detail the various aspects of the present invention described above, it is understood that modifications to the illustrative embodiments will readily occur to persons with ordinary skill in the art having had the benefit of the present disclosure. All such modifications and variations are deemed to be within the scope and spirit of the present invention as defined by the accompanying Claims to Invention.

What is claimed is:

1. A module subassembly comprising:
    an element having a planar surface and at least an edge portion which is transparent to electromagnetic radiation;
    a plurality of active circuit devices disposed in juxtaposition with said planar surface and spaced from said an edge portion; and
    encoding means extending from a portion of said plurality of active circuit devices and terminating at the outer edge of said at least an edge portion.

2. A module subassembly according to claim 1 wherein said element is a semiconductor.

3. A module subassembly according to claim 1 wherein said element is an electrically insulating material.

4. A module subassembly according to claim 1 wherein said element is an electrically insulating material.

5. A module subassembly according to claim 1 wherein said element is silicon.

6. A module subassembly according to claim 1 wherein said element is made of lithium niobayte.

7. A module subassembly according to claim 1 wherein said active circuit devices are transistors.

8. A module subassembly according to claim 1 wherein said active circuit devices are memory cells.

9. A module subassembly according to claim 1 wherein said active circuit devices are logic circuits.

10. A module subassembly according to claim 1 wherein said active circuit devices are comparator circuits.

11. A module subassembly according to claim 1 wherein said active circuit devices are switchable optical devices.

12. A module subassembly according to claim 1 wherein said active circuit devices are optical circuits.

13. A module subassembly according to claim 1 wherein said active circuit devices are Josephson junctions.

14. A module subassembly according to claim 1 wherein said active circuit devices are electrically switchable devices disposed in insulated spaced relationship with said planar surface.

15. A module subassembly according to claim 1 wherein said element is made of III-V compound semiconductor materials and their alloys.

16. A module subassembly according to claim 1 wherein said element is made of gallium arsenide.

17. A module subassembly according to claim 1 wherein said element is a metal.

18. A module subassembly according to claim 1 wherein said edge portion is an oxide of a metal.

19. A module subassembly according to claim 1 wherein said edge portion is an oxide of silicon.

20. A module subassembly according to claim 1 wherein said edge portion is a material transparent to electromagnetic radiation.

21. A module subassembly according to claim 1 wherein edge portion is a material transparent to ultra-violet radiation.

22. A module subassembly according to claim 1 wherein said edge portion is an insulator transparent to electromagnetic radiation.

23. A module subassembly according to claim 1 further including a heat dissipating metal film having a waffle iron-like shape extending from the underside of said element.

24. A module subassembly according to claim 1 further including a heat dissipating metal film having a waffle iron-like shape extending from the underside of said element.

25. A module subassembly according to claim 1 further including a copper film disposed contiguously with the underside of said element.

26. A module subassembly according to claim 1 wherein said element is flexible.

27. A module subassembly according to claim 1 wherein said element is rigid.

28. A module subassembly according to claim 1 wherein said encoding means includes at least a pair of encoder lines extending from said portion of said plurality of active circuit devices and terminating at said outer edge.

29. A module subassembly according to claim 1 wherein said portion of said plurality of active circuit devices is a comparator circuit.

30. A module subassembly according to claim 1 wherein said active circuit devices are CMOS devices.

31. An assembly according to claim 1 further including a first plurality address transmission lines extending over said at least an edge portion and said element to at least one of said plurality of active circuit devices and terminating at said outer edge of said at least an edge portion.

32. An assembly according to claim 1 further including a second plurality of data and power transmission lines extending over said at least an edge portion to an least another of said plurality of active circuit devices and terminating at said outer edge of said at least edge portion.

33. A module subassembly according to claim 28 further including means disposed perpendicular to said at least a pair of encoder lines and adjacent to said outer edge connected to said at least a pair of encoder lines for one of enabling and disabling at least one of the devices of said portion of said plurality of active circuit devices.

34. A module subassembly according to claim 28 wherein said encoder lines are made of metal.

35. A module subassembly according to claim 28 wherein said encoder lines are made of heavily doped silicon.

36. A module subassembly according to claim 28 wherein said encoder lines are passivated with an oxide of silicon.

37. A module subassembly according to claim 28 wherein said encoder lines are optical transmission lines.

38. A module subassembly according to claim 29 wherein said encoder lines are made of titanium dioxide.

39. A module subassembly according to claim 29 further including at least a pair of encoder lines extending from said outer edge to said comparator circuit, and, means disposed perpendicular to said at least a pair of encoder lines and adjacent to said outer edge connected to said at least a pair of encoder lines for one of enabling said plurality of active circuit devices.

40. An assembly according to claim 31 wherein said address transmission lines are electrically conductive.

41. An assembly according to claim 31 wherein said address transmission lines are optical fibers.

42. An assembly according to claim 32 wherein said data and power transmission lines are electrically conductive.

43. A module subassembly according to claim 32 wherein said data and power transmission lines are optical fibers.

44. A module subassembly according to claim 33 wherein said means for one of enabling and disabling is a shorting strap interconnecting said at least a pair of said plurality of pairs of encoder lines.

45. A module subassembly according to claim 33 wherein said means for one of enabling and disabling is a shorting strap interconnecting said at least a pair of said plurality of pairs of encoder lines.

46. A three dimensional module assembly comprising:
   a plurality of elements each having a planar surface and at least an edge portion which is transparent to electromagnetic radiation, said elements and said edge portions being disposed in registry in a stack, each of said elements having a plurality of active circuit devices disposed in juxtaposition with said planar surface and spaced from said an edge portion, and,
   encoding means extending from a portion of said plurality of active circuit devices and terminating at the outer edge of said at least an edge portion of each of said elements.

47. An assembly according to claim 46 wherein said encoding means includes at least a pair of encoder lines extending from said outer edge to said portion of said plurality of active devices.

48. An assembly according to claim 46 wherein said encoding means includes at least a pair of encoder lines extending from said outer edge to said portion of said plurality of active devices.

49. An assembly according to claim 46 wherein said encoding means includes at least a pair of encoder lines extending from said outer edge to said portion of said plurality of active devices, and, means disposed perpendicular to said at least a pair of encoder lines and adjacent to said outer edge connected to said at least a pair of encoder lines for one of enabling and disabling at least one of the devices of said portion of said plurality of active devices.

50. An assembly according to claim 46 wherein said portion of said plurality of active devices is a comparator circuit, said encoding means includes at least a pair of encoder lines extending from said outer edge to said comparator circuit, and, means disposed perpendicular to said at least a pair of encoder lines and adjacent to said outer edge connected to said at least a pair of encoder lines for one of enabling and disabling at least one of the devices of said comparator.

51. An assembly according to claim 46 further including a heat dissipating and spacing element disposed contiguously with the underside of each of said plurality of elements.

52. An assembly according to claim 46 further including bonding means interposed between pairs of said edge portions in registry with said edge portions and contiguous with at least a portion of said encoding.

53. An assembly according to claim 46 further including a first plurality of address transmission lines extending over each said edge portion and each said element to at least one of said plurality of active circuit devices and terminating at said outer edger of each said edge portion.

54. An assembly according to claim 46 further including a second plurality of power and data transmission lines extending over each said edge portion and each said element to at least another of said plurality of active circuit devices and terminating at said outer edge of each said edge portion.

55. An assembly according to claim 46 further including at least a single layer of interconnections disposed over said outer edges of said edge portions containing interconnections on a surface thereof.

56. An assembly according to claim 47 wherein said encoder lines are electrically conductive.

57. An assembly according to claim 47 wherein said encoder lines are optical transmission lines.

58. An assembly according to claim 49 wherein said means for one of enabling and disabling is a shorting strap interconnecting said at least a pair of said plurality of pairs of encoder lines.

59. An assembly according to claim 50 wherein said means for one of enabling and disabling is a shorting strap interconnecting said at least a pair of said plurality of pairs of encoder lines.

60. An assembly according to claim 52 wherein said bonding means is an ultra-violet curable material which is electrically insulating.

61. An assembly according to claim 52 wherein said bonding means is an ultra-violet light curable material which is electrically insulating.

62. An assembly according to claim 53 wherein said first plurality of address transmission lines are electrically conductive.

63. An assembly according to claim 53 further including a third plurality of transmission lines interconnected with said first plurality of address transmission lines being perpendicular to said first plurality of address transmission lines and extending over at least a pair of said outer edges of said edge portions.

64. An assembly according to claim 53 wherein said first plurality of address transmission lines are optical transmission lines.

65. An assembly according to claim 54 wherein said second plurality of data and power transmission lines are electrically conductive.

66. An assembly according to claim 54 wherein said second plurality of data and power transmission lines are optical transmission lines.

67. An assembly according to claim 54 further including a fourth plurality of transmission lines interconnected with said second plurality of data and power transmission lines being perpendicular to said second plurality of data and power transmission lines and extending over at least one of said outer edges of said edge portions.

68. An assembly according to claim 55 further including connector means electrically connected to said at least a layer of interconnections for applying electrical signals and power to said each of said elements.

\* \* \* \* \*